United States Patent [19]
Niewmierzycki

[11] Patent Number: 5,452,521
[45] Date of Patent: Sep. 26, 1995

[54] WORKPIECE ALIGNMENT STRUCTURE AND METHOD

[76] Inventor: Leszek Niewmierzycki, 5328 Studebaker Cir., San Jose, Calif. 95136

[21] Appl. No.: 209,753

[22] Filed: Mar. 9, 1994

[51] Int. Cl.⁶ .................................................. G01D 21/00
[52] U.S. Cl. ........................... 33/520; 414/936; 33/644
[58] Field of Search ....................... 33/520, 534, 537, 33/549, 644, 645, 701, 791, 832, 833, 1 N; 414/754, 757, 774, 775, 936

[56] References Cited

U.S. PATENT DOCUMENTS

| | | | |
|---|---|---|---|
| 3,174,392 | 3/1965 | Rantsch | 33/791 |
| 4,457,664 | 7/1984 | Judell et al. | 414/779 |
| 4,833,790 | 5/1989 | Spencer et al. | 33/644 |
| 5,085,558 | 2/1992 | Engelbrecht | 414/754 |
| 5,308,222 | 5/1994 | Bacchi et al. | 414/936 |

FOREIGN PATENT DOCUMENTS

| | | | |
|---|---|---|---|
| 62-206847 | 9/1987 | Japan | 414/936 |
| 2-155252 | 6/1990 | Japan | 414/936 |

OTHER PUBLICATIONS

"Vacuum Wafer Aligner", Mar. 5, 1990, Brooks Automation.
"Non Edge–Contact Wafer Aligner Manual", Nov. 20, 1989, Brooks Automation.

Primary Examiner—William A. Cuchlinski, Jr.
Assistant Examiner—G. Bradley Bennett
Attorney, Agent, or Firm—Skjerven, Morrill, MacPherson, Franklin & Friel; Alan H. MacPherson

[57] ABSTRACT

This invention teaches an apparatus and method for detection and correction of eccentricity and angular misalignment of a wafer. The position of a wafer is determined while the wafer is stationary on a robot arm by position sensors that locate four points on the periphery of the wafer. A microprocessor selects and uses a specific combination of three of the four points to calculate the actual location of the center of the wafer. The microprocessor produces signals which are used to correct the wafer's eccentricity using two rotatable shafts, an inner shaft mounted inside an outer shaft. The outer shaft is rotated prior to arrival of the wafer, in order to position the inner shaft at a pre-determined location depending on the eccentricity to be corrected. After the wafer is placed on a turntable mounted on and rotatable by the inner shaft, the inner shaft is rotated by the requisite angle to eliminate the wafer's eccentricity in a single movement. Optionally, to correct angular misalignment of the wafer, the outer shaft is rotated by the desired angle simultaneous with the inner shaft rotation. For process shifts, both eccentricity and angular misalignment are corrected in a single movement of the wafer.

16 Claims, 17 Drawing Sheets

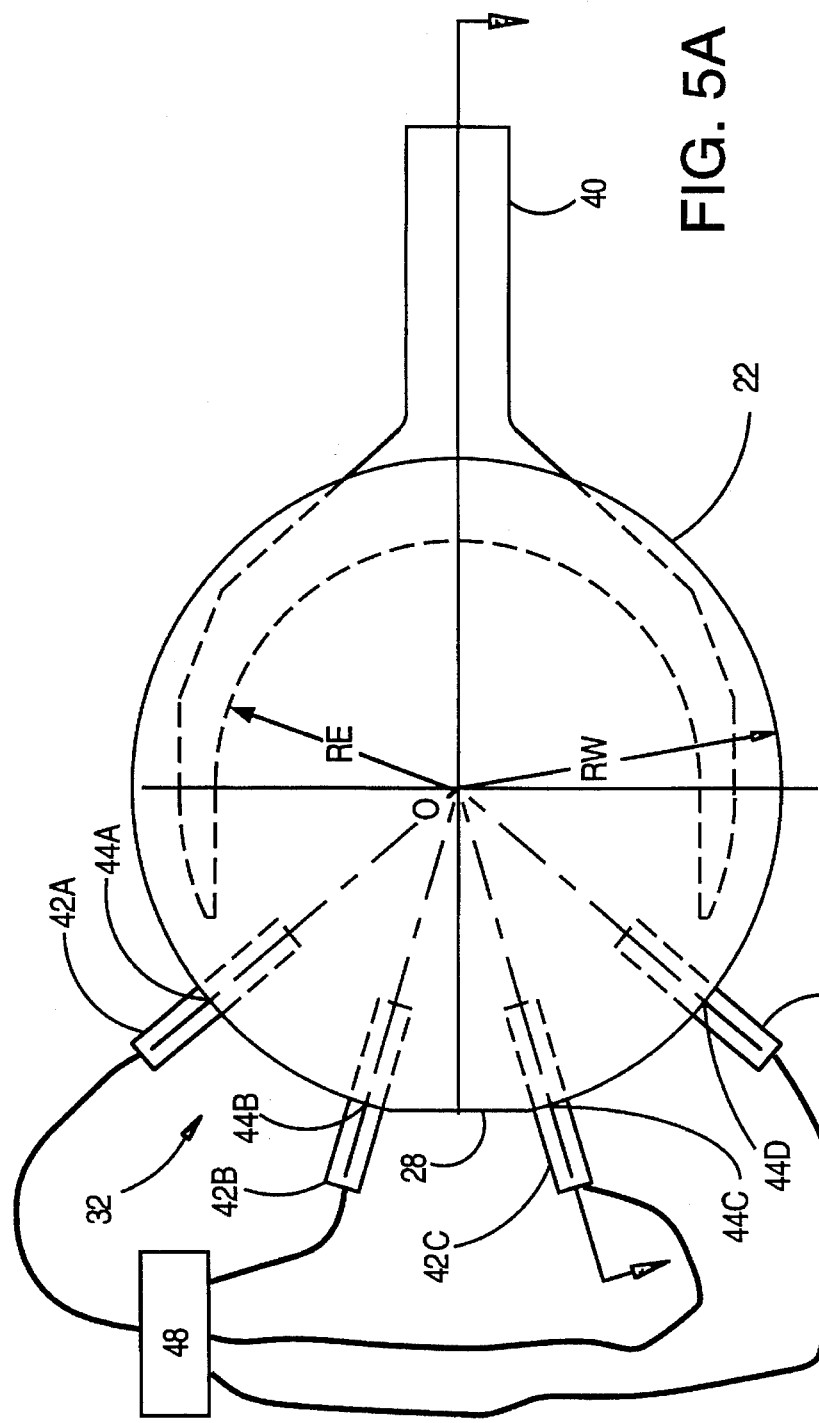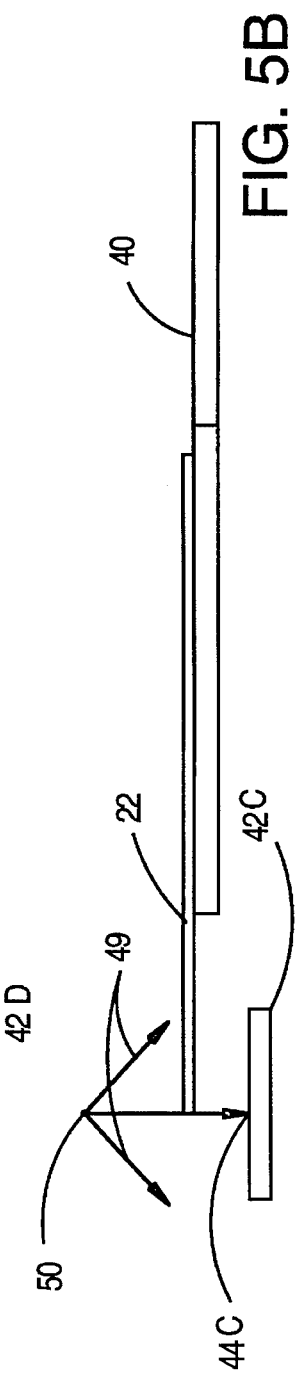

WORKPIECE ALIGNMENT STRUCTURE AND METHOD

FIELD OF INVENTION

The present invention relates to an apparatus and method for detecting and correcting eccentricity and angular misalignment of a workpiece and in particular to an apparatus and method for detecting and correcting the eccentricity and misalignment of a semiconductor wafer in closed, reduced pressure chambers.

BACKGROUND OF THE INVENTION

In semiconductor device manufacturing, it is necessary to align wafers during the manufacturing process. Semiconductor wafers have well defined shapes and sizes. Standard wafer shapes include centroids having one or more flat sides at their edge. Semiconductor wafers are manufactured with very accurate dimensions. During semiconductor device manufacturing, the wafers are subjected to many chemical processes. Because the different chemical processes are carried out in separate reaction chambers, the wafers have to be transported from one reaction chamber to another. During transportation and handling, the wafers are extremely vulnerable to particulate contamination. Therefore it is advantageous to use a single wafer, multiple chamber, integrated vacuum wafer processing system capable of performing a variety of processes without removal of the wafer from the vacuum enclosure.

In prior art wafer processing systems (such as cluster tool 10 of FIGS. 1A to 1D) the wafers enter via entry cassette 12 and are transported, one at a time, horizontally by a robot arm 14 in a repeatable and accurate manner, first to a wafer aligner 11 in chamber 13A and then from chamber 13A to consecutive chambers (such as 13B, 13C and 13D) and exit via exit cassette 16. The robot arm is capable of some vertical movement in the process chambers to allow the arm to perform a procedure called a handout. During a first handout, a two-pronged terminal portion of the robot arm (called "end effector") is moved underneath one of several wafers stacked in entry cassette 12. Then the cassette moves vertically downward by a distance sufficient for the wafer to be picked up by the robot arm's end effector 15.

As a general rule, wafers in entry cassette 12 do not have a well defined position with respect to the entry cassette. The position of a wafer's center can be shifted and rotated with respect to the position of other wafers' centers and with respect to the center of the entry cassette. Also, a wafer's flat side can be at any random angular orientation. As a result, a wafer's initial position on the robot arm's end effector (prior to any processing) can vary substantially.

FIG. 2 shows a wafer 22 with center $O_2$ in a position different from desired position 29 (shown with dotted line) with center $O_1$ that coincides with the end effector's center. Such a shift in the wafer's initial position from a desired position (henceforth "initial" shift) can be quite detrimental to the workings of a cluster tool. Therefore, after a wafer 22 is taken out of entry cassette 12, it is necessary to first transfer wafer 22 to a wafer aligner 11 such as the one shown in chamber 13A of FIG. i and in greater detail in FIG. 2. The wafer's position is corrected and made the same for each wafer in relation to the end effector by wafer aligner 11. After alignment, wafer 22 is transferred to a process chamber (such as chamber 13B of FIG. 1) for further processing. In process chamber 13B, robot arm 14 lowers wafer 22 until wafer 22 rests on a receptor in the chamber. Then the robot arm 14 withdraws into a central chamber 18 (see FIGS. 1A–1D). After the processing is completed, the robot arm 14 returns, picks up the wafer 22 in a handout and moves the wafer 22 to consecutive chambers such as, for example, chambers 13C and 13D (see FIG. 1C) thus subjecting the wafer 22 to several handouts. Each handout creates a likelihood of a shift in a wafer's position from its desired position 29 (henceforth "process" shift) by linear distance $\Delta r$ at an angle $\psi$ (see, for example, FIG. 2) and a likelihood of the wafer's flat side rotating from the desired angular orientation by an angle $\gamma$. In FIG. 2, angle $\psi$ is measured with respect to the direction of fork movement 25 and angle $\gamma$ is measured with respect to a radial line passing through the center of rotation of robot arm 14 (FIG. 1). The distance $\Delta r$ between the actual position of the wafer's center and the desired position is the eccentricity of the wafer. Over time, as a result of several handouts, the eccentricity and the angular misalignment of a wafer can accumulate.

Detection of a wafer's shape and center is done in wafer aligner 11 by illuminating the top surface of the wafer and rotating the wafer 360° over a linear optical sensor 24 (FIG. 2) capable of instantaneously determining the percentage of the sensor's length covered by the shade of the wafer. The signal output of sensor 24 and the corresponding angular position of the wafer are used by a microprocessor (not shown) to calculate the actual position of the center of the wafer as well as the wafer's angular misalignment. This operation of rotating a wafer and determining its position and misalignment is called scanning.

Centering and angular alignment of wafer 22 are accomplished by wafer aligner 11 in chamber 13A by first rotating wafer 22 in the anticlock wise direction 27 by a calculated angle $\psi$ (FIG. 2), then lifting wafer 22 from a turntable 20 used to rotate the wafer, translating the wafer 22 horizontally for a calculated distance $\Delta r$ using a dedicated fork 26 having vertical and horizontal movement capability and finally lowering the wafer 22 back onto turntable 20. These four steps can be adequate to bring the center of the wafer to the desired position. Finally, the wafer can be rotated by a desired angle such as $\psi$-$\gamma$ so that flat side 28 of wafer 22 is brought into an angular orientation necessary for further processing of the wafer.

The prior art wafer aligner 11 is disadvantageous because during scanning, the wafer 22 is rotated before the wafer's center is made coincident with the center of rotation. Rotation of the wafer 22 with the wafer's center of mass being offset from the axis of rotation results in a centrifugal force on the wafer. In the above arrangement, the wafer 22 is held on the turntable 20 only by frictional forces which are quite small due to smoothness of the wafer. If the centrifugal force overcomes the frictional forces (as is more likely to happen when the rotational speed is increased to increase throughput), the wafer's center will move further away from the center of rotation thus making the wafer's position worse instead of correcting the wafer's position. Therefore an increase in rotational speed to shorten the scanning time for improving throughput is not feasible because of the resulting higher centrifugal force.

Also in wafer aligner 11 described above, the fork 26 is operated through a barrier for maintaining reduced pressure in the chamber 13A. In the prior art, the fork 26 is sealed using vacuum bellows (not shown). However, vacuum bellows create particulate contamination. Also, vacuum bellows restrict the horizontal movement of the fork 26 so that the eccentricity of the wafer 22 may not be correctable in a single step. If an additional step is required to completely correct the wafer's position the resulting throughput is reduced. Also, such an additional step may require a handout thus creating additional particulate contaminants. Finally, because throughput of the prior art wafer aligner 11 is limited, it is not practical to use the wafer aligner 11 to correct process shifts created by handouts in consecutive process chambers (as described above). The inability to correct process shifts imposes a limitation on the number of process chambers and the types of processes that can be performed on a prior art cluster tool.

SUMMARY OF THE INVENTION

This invention permits detection of eccentricity without movement of a wafer and permits correction of the eccentricity in a single movement of the wafer. In accordance with this invention, a microprocessor accurately determines the position of a wafer using an array of sensors while the wafer is stationary on a robot arm. The wafer's eccentricity is corrected using two rotatable shafts, an inner shaft mounted inside an outer shaft. The outer shaft is rotated prior to arrival of the wafer, in order to position the inner shaft at a pre-determined location depending on the eccentricity (as measured by sensors) to be corrected. After the wafer is placed on a turntable mounted on the inner shaft, the inner shaft is rotated by the requisite angle to eliminate the wafer's eccentricity in a single movement. Optionally, to correct angular misalignment of a wafer's flat side, the outer shaft is rotated by a desired angle simultaneous with the inner shaft rotation.

In accordance with this invention, sensors in the sensor array are located around a wafer's edge so as to allow each sensor to instantaneously determine the position of a point on the edge in relation to the center of the end effector of the robot arm. During operation, while a wafer is being taken out of the entry cassette and on the way to a first process chamber, the robot arm stops at the sensor array in the central chamber of the cluster tool. The sensors report their measurements of the positions of the corresponding edges of the wafer to the microprocessor. Using this sensor information and the known shape of wafers currently being processed, the microprocessor calculates the actual location of the center of the wafer. An advantage of using such an array of sensors is that the position of the wafer is detected while the wafer is stationary on the robot arm without any movement of the wafer. Such non-contact, stationary detection permits very high speeds and reduces particulate contaminants.

In accordance with this invention the inner shaft of a wafer aligner is mounted offset from the center of the outer shaft. The inner shaft has a turntable at one end to support and rotate the wafer. The inner shaft is capable of rotation relative to the outer shaft. The outer shaft is capable of rotation relative to the base of the apparatus. Both shafts are equipped with electric motors which continuously report the angular positions of their shafts to the microprocessor. Both shafts can be equipped with rotary magnetic fluid seals to allow rotation through a barrier for maintaining reduced pressure in the chamber while minimizing particulate contaminants. Based on the actual location of the wafer, the microprocessor calculates the angles of rotation of inner and outer shafts necessary for the center of the wafer to coincide with the outer shaft's axis of rotation. The outer shaft's rotation occurs before the wafer is placed on the turntable. Once the inner shaft is properly positioned by the outer shaft rotation, the robot arm places the wafer on the turntable and waits with its end effector below the bottom surface of the wafer. Then the microprocessor signals the inner shaft motor to execute the calculated rotation angle which results in centering the wafer. One advantage of using the two shaft arrangement is that the wafer's eccentricity is corrected in a single movement of the wafer by the inner shaft. Such single movement correction of eccentricity permits higher speeds and minimizes particulate contaminants.

To eliminate angular misalignment, the wafer is first rotated to detect the angular location of the characteristic edge shape feature. Then the microprocessor calculates the necessary correction angle and rotates the outer shaft by this angle to bring the characteristic edge shape feature to its desired angular position. An advantage of rotation after correction of eccentricity is minimization of the danger of the wafer shifting during rotation because in this case the center of mass of the wafer lies on the axis of rotation of the outer shaft.

This invention increases wafer throughput, decreases particulate contamination and increases the quality of the wafers being processed.

BRIEF DESCRIPTION OF THE FIGURES

FIGS. 5A and 5B illustrate a plan view and a front elevation view of the desired position of the wafer in relation to the array of sensors after correction of eccentricity and angular misalignment.

DETAILED DESCRIPTION

In accordance with one embodiment of this invention, in a wafer processing apparatus 30 (see FIG. 3) the wafers enter via entry chamber 31A, are transported by a robot arm 14 to various process chambers 31B, 31C, 31D, 31E and exit via exit chamber 31F. A sensor array 32A (including sensors 42A, 42B, 42C and 42D) in central chamber 33 of apparatus 30 is used to determine the initial geometric center of a wafer 22 while wafer 22 is stationary on robot arm 14. After the wafer's initial position is determined, an aligner 34A is used to correct any eccentricity (due to an initial shift) of wafer 22. The eccentricity is corrected by aligner 34A in a single movement of wafer 22. Optionally after wafer 22 is brought to its centered position, any angular misalignment of wafer 22's characteristic edge shape feature (typically a "flat" portion of the wafer's circular circumference) can also be corrected using limited rotational movement.

Figure 1A:
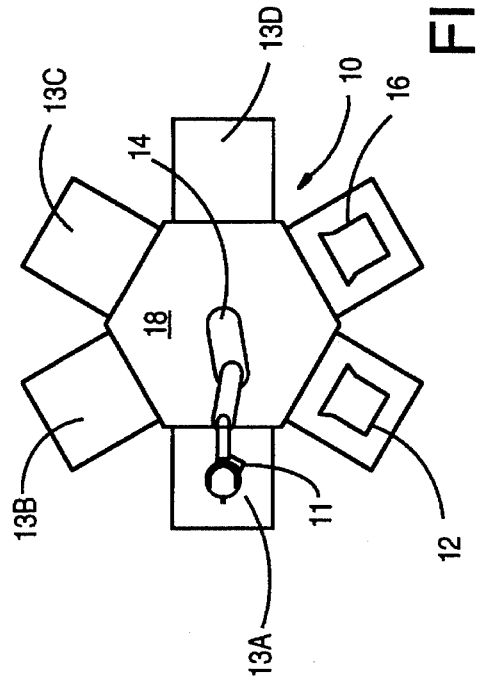
FIGS. 1A–1D illustrate the prior art cluster tool system.
Figure 1B:
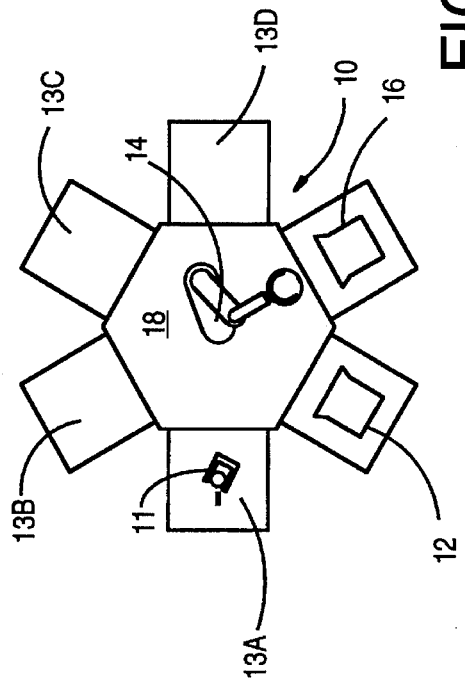
Figure 1C:
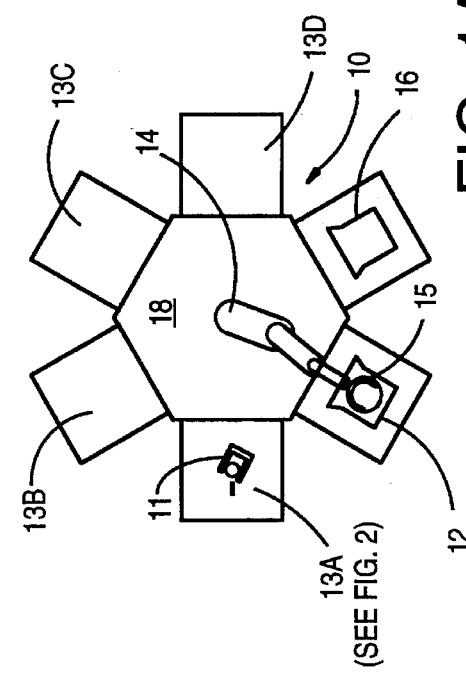
Figure 1D:
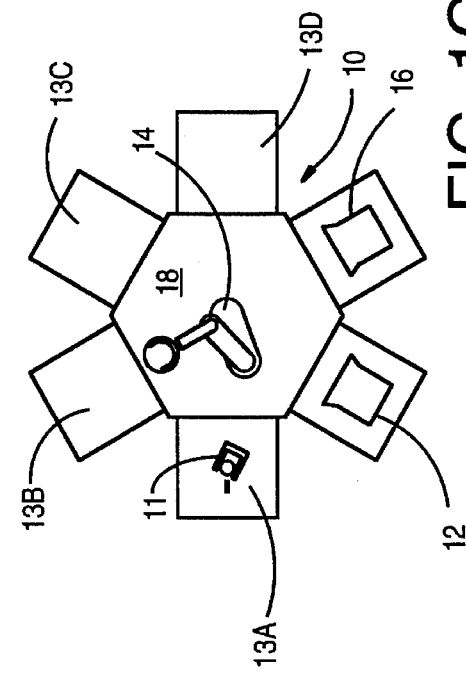
Figure 2:
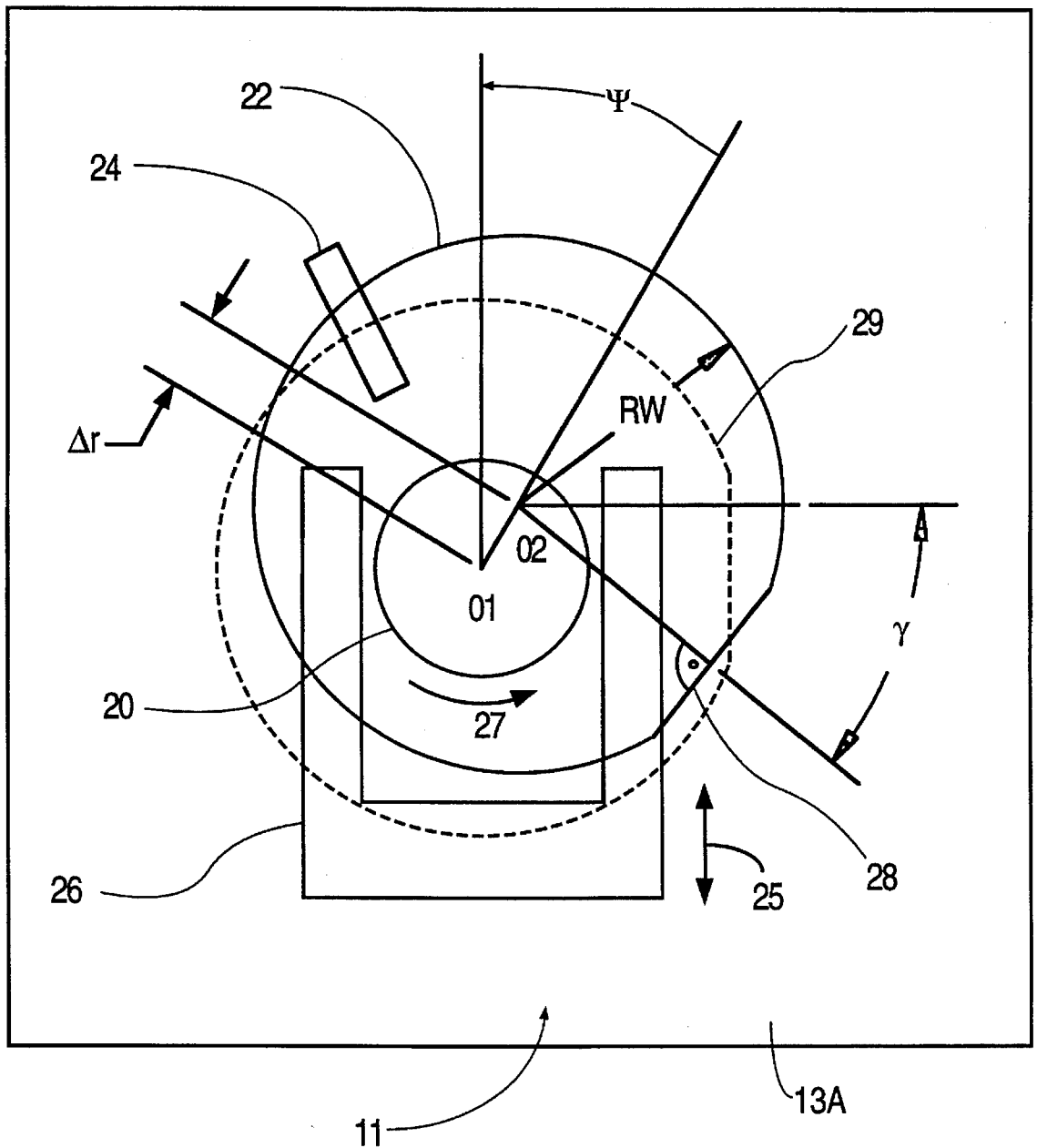
FIG. 2 is a schematic of a prior art mechanism for detection and correction of eccentricity and angular misalignment of a wafer.
Figure 3:
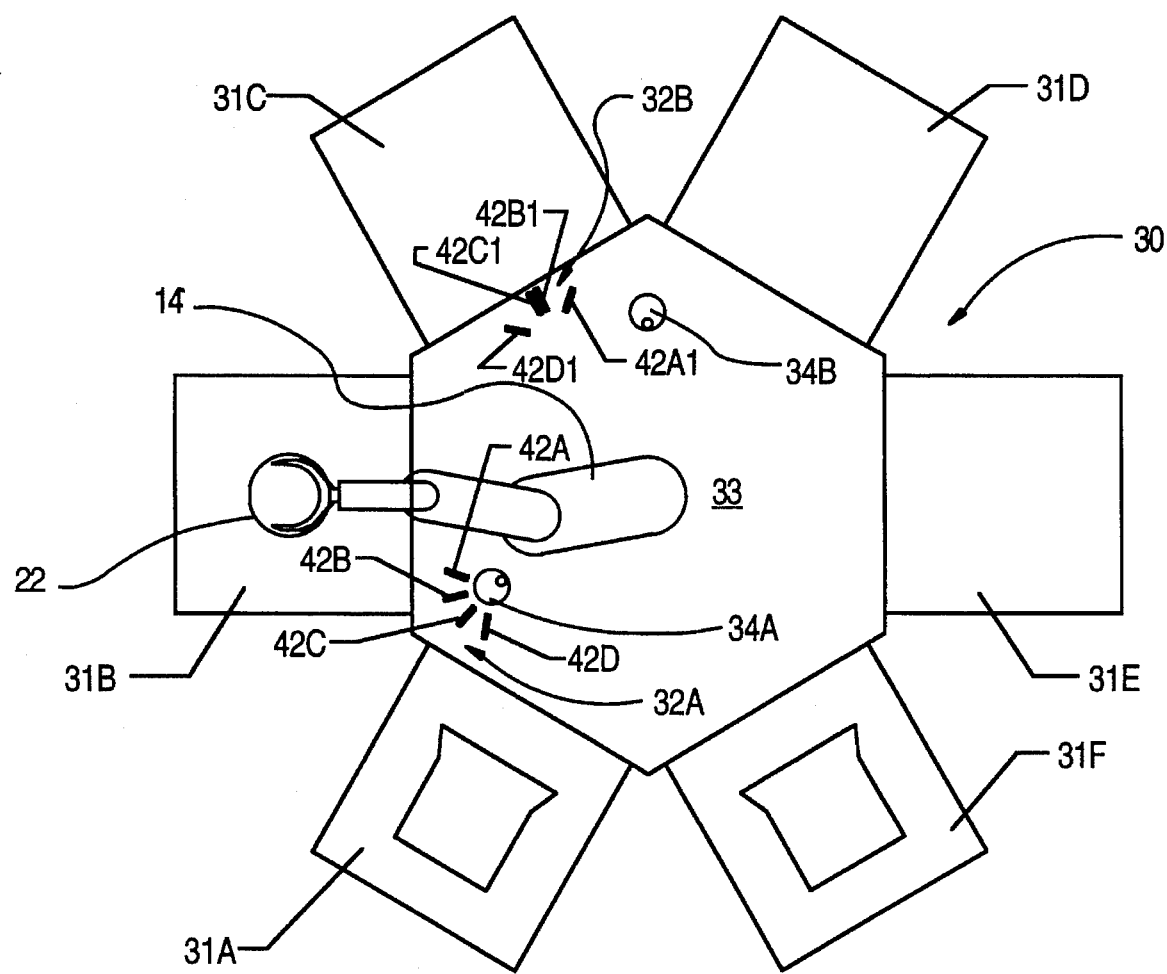
FIG. 3 illustrates a plan view of an embodiment of an apparatus for detecting and correcting eccentricity and angular misalignment in accordance with this invention.

After correction of initial shift at aligner 34A, wafer 22 is transferred to the process chamber 31B by robot arm 14 via a handout. After processing is completed in chamber 31B, wafer 22 is picked up by robot arm 14 in another handout. Process shifts in the wafer's position due to handouts such as the ones in chamber 31B are detected at sensor array 32B (including sensors 42A1, 42B1, 42C1 and 42D1) and if necessary, corrected by wafer aligner 34B. Sensor array 22B allows the position of wafer 22 to be determined after each handout from the chambers 31B through 31E in the central chamber 33. If desired, the position of wafer 22 can be determined using sensor array 32B after wafer 22 is removed from selected ones of chambers 31B through 31E rather than from all of these chambers. The location of sensor array 32B and wafer aligner 34B is shown outside chamber 31C. Sensor array 32B and corresponding wafer aligner 34B can be placed outside whichever chamber 31B through 31E requires determination of the location of the wafer 22 most often. This chamber 31X would be the chamber where the likelihood of a process shift in the position of wafer 22 is highest. Alternatively, additional sensor arrays and wafer aligners, such as chamber array 32B and wafer aligner 34B can be used inside central chamber 33. The two sensor arrays 32A and 32B and the two corresponding wafer aligners 34A and 34B are merely illustrative of sensor arrays and wafer aligners that can be used in central chamber 33. Of course, sensor array 32A and corresponding wafer aligner 34A will generally always be located directly adjacent to entry chamber 31A as shown in FIG. 3 to allow the system to correct initial shifts.

Figure 4:
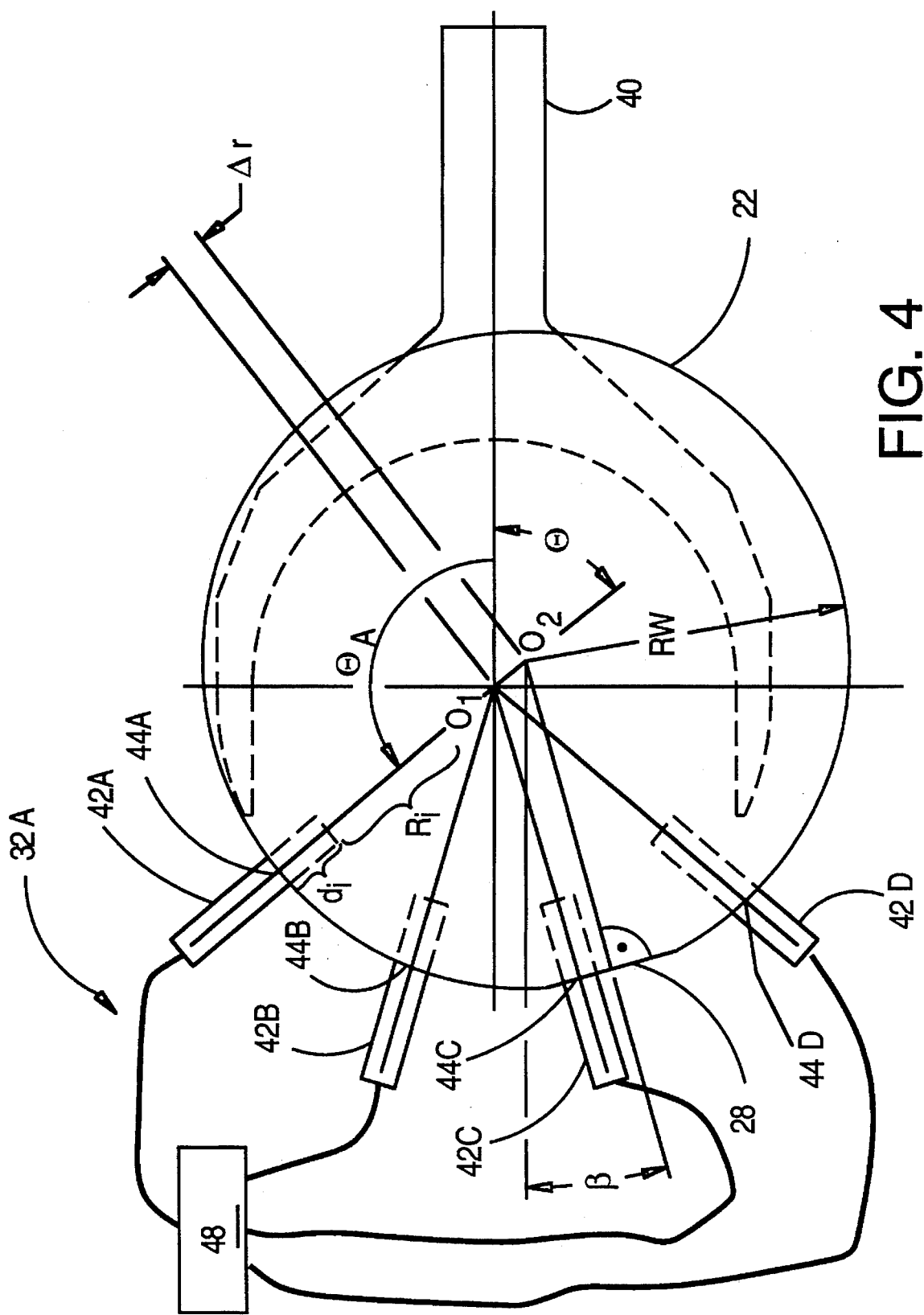
FIG. 4 illustrates an initial position of the wafer in relation to the array of sensors of FIG. 3 arranged to detect inital shifts of a wafer.

Generally wafers are brought to sensor array 32A by end effector 40 of robot arm 14 as shown in FIG. 4. Wafer 22 with radius RW, center $O_2$ and flat side 28 is offset from the desired position of its center (which coincides with center $O_1$ of end effector 40 of robot arm 14) by distance $\Delta r$ at an angle $\theta$ to the centerline CL of an effector 40. In FIG. 4, angle $\theta$ is measured with respect to a radial line CL passing through the center of rotation of robot arm 14 and center $O_1$ of end effector 40. In FIG. 4, wafer 22 has an angular misalignment of $\beta$.

Figure 5C:
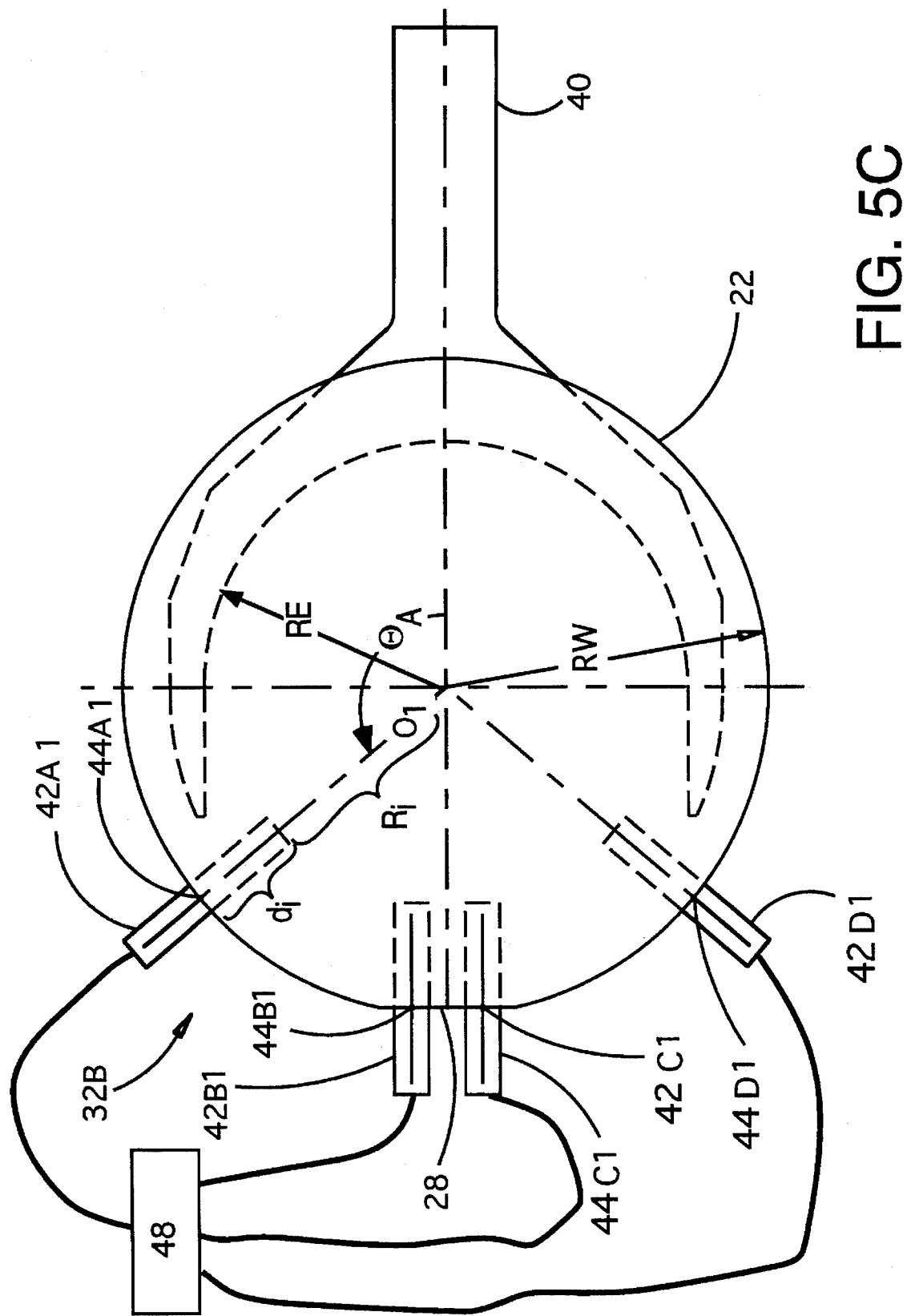
FIG. 5C illustrates a sensor arrangement for the detection of process shifts of a wafer.
Figure 7:
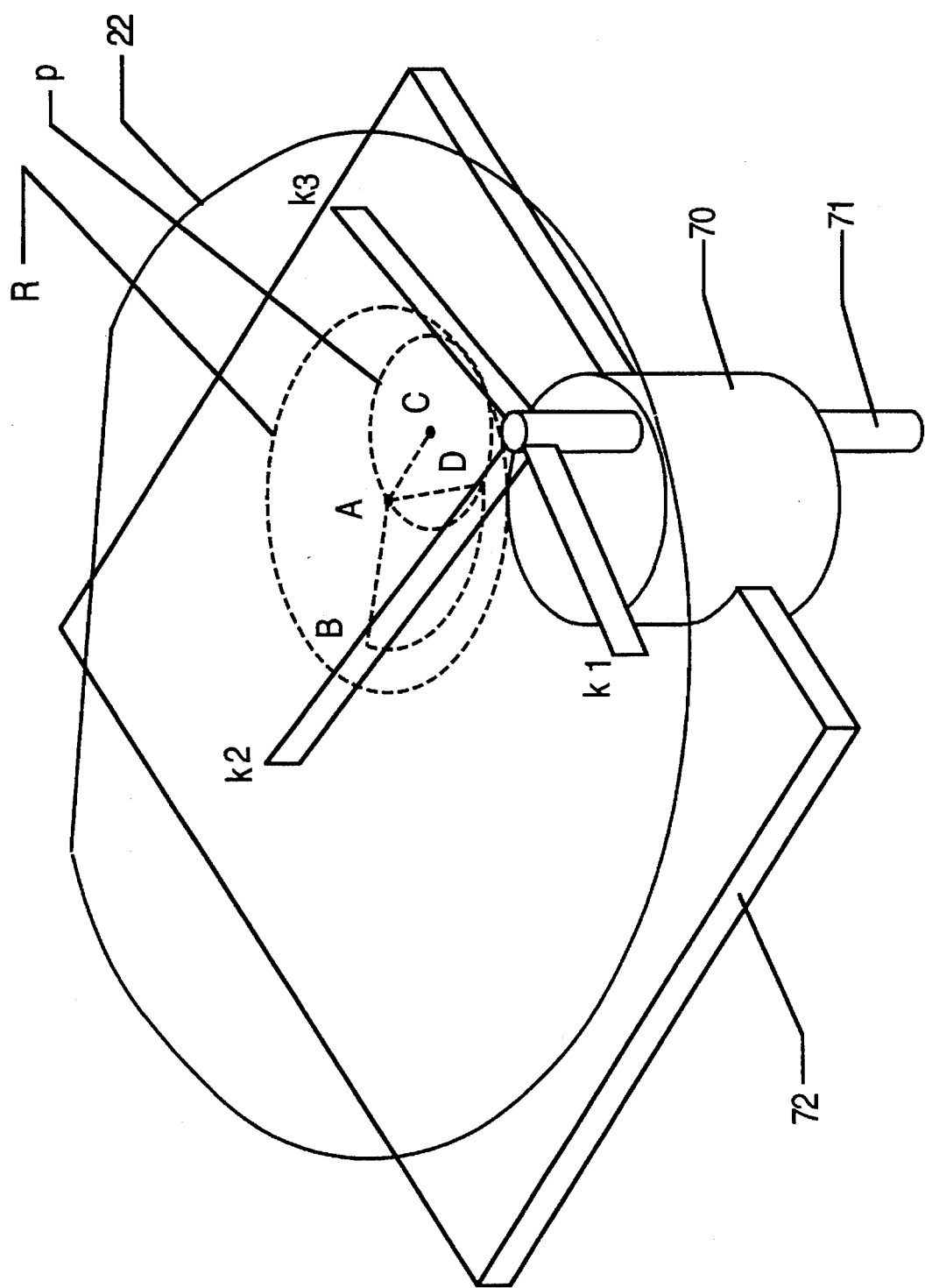
FIG. 7 illustrates a perspective view of the aligner prior to rotation of any of the rotatable shafts.

The purpose of a wafer aligner (such as 34A or 34B in FIG. 3) is to bring wafer 22 to the desired position at the center $O_1$ of end effector 40 (shown in FIGS. 5A and 5C for arrays 32A and 32B respectively). Robot arm 14 (FIG. 3) always finishes its motion in the same position relative to a sensor array (such as 32A or 32B of FIG. 3) and relative to an aligner (such as 34A or 34B of FIG. 3). At the end of horizontal movement of the robot arm 14, the center $O_t$ of end effector 40 of the robot arm is positioned at the intersection O of radial lines through sensors 42A–42D (see FIG. 5A). Sensors 42A–42D can be well known linear sensors such as charge coupled device (CCD) sensors. Center point 0 shown in FIG. 5A is also on the axis of rotation of outer shaft 70 (FIG. 7).

FIG. 5A shows the location of sensors 42A, 42B, 42C and 42D (of sensor array 32A of FIG. 3) positioned so as to detect an initial inital shift of wafer 22 with respect to the desired position. Each of sensors 42A–42D is positioned on one side of wafer 22 (as shown in FIG. 5B for sensor 42C) to determine the position of the wafer's center and the angular misalignment of the flat side of the wafer. A beam of light 49 from a light source 50 illuminates wafer 22 on the side of wafer 22 apposite the side facing sensor 42C so as to cast the wafer's shade onto sensors 42A–42D.

Each of sensors 42A–42D is capable of instantaneously determining the percentage of its length covered by the shade of the wafer. Length information $d_i$ (see FIG. 4) is determined for the location of each of four periphery points (on the edge of the wafer) 44A–44D and is transmitted to a microprocessor 48. In sensor array 32A (FIG. 5A), the individual sensors 42A–42D are arranged in such a way that at most only one of the sensors is covered by the wafer's flat side 28 at any one time. In one such arrangement of sensor array 32A (FIG. 3) the distance between two adjacent sensors (such as 42A and 42B or 42B and 42C or 42C and 42D) is at least equal to the length of flat side 28. Sensors 42A to 42D send their signals regarding the periphery points 44A to 44D to microprocessor 48 which calculates the wafer's eccentricity.

Generally any three points on a circular circumference of wafer 22 allow calculation of both radius and location of the center of the circular edge of the wafer. The radius of the circular edge of wafer 22 is a known quantity because the shape and size of the wafers being processed are well known. In FIG. 4, from among the four points 44A, 44B, 44C and 44D any three points can be used to determine the radius and the location of the center of wafer 22. From such a set of four points, there are four different combinations of sets of three points. Generally, out of any four points A, B, C and D one can make the following sets of three points: ABC, BCD, ABD, and ACD. If the flat side 28 of wafer 22 does not overlay any of the four sensors, all combinations of three points will result in substantially the same radius and center location. If one of the points is covered by the flat side of a wafer, three out of the four combinations of points will give the wrong radius value and the wrong location of the center. Only one combination of three points that represents the circular section of the wafer's circumference will yield a radius value substantially identical to the known radius of the wafer. In FIG. 4 flat side 28 of wafer 22 is shown covering sensor 42C at point 44C. The microprocessor 48 takes all four combinations of periphery points in the manner listed above and calculates four values for the radius of the wafer in a well known manner using well known geometric principles. Then the four values for the radius are compared with the known radius value, and the particular set of three points that yields a radius closest to the known radius is used to determine the location of the center of the wafer. In the example shown in FIG. 4, combination of points 44A, 44B and 44D will be used.

In one embodiment, microprocessor 48 determines the center and radius of a circle passing through any three points as follows. First, the polar coordinates of the three points are computed by microprocessor 48 from the sensor data relayed by sensor array 32A. FIG. 4 shows the location of sensors 42A, 42B, 42C and 42D (of sensor array 32A of FIG. 3) positioned so as to detect the center of wafer 22 with respect to the desired position. As shown in FIG. 4, the inner end of sensor 42A is at a distance $R_i$ (a known quantity based on the design) from the center $O_i$. The wafer's edge 44A is at a distance of $d_i$ from the inner end of sensor 42A, so that the polar coordinates of point 44A are given by $(R_i+d_i, \theta_A)$. The coordinates of points 44B, 44C and 44D are computed by microprocessor 48 in a similar manner from the known positions of the sensors and the periphery points information relayed from the sensors using well known geometric principles. Microprocessor 48 then computes the eccentricity and angular misalignment of wafer 22 using the formulas given in Appendix A.

FIG. 5C shows the sensor arrangement for detection of process shifts of wafer 22. In sensor array 32B, the individual sensors are arranged in such a way that the outer sensors 42A1 and 42D1 are covered by the wafer's circular edge while the inner sensors 42B1 and 42C1 are covered by the wafer's flat side 28. The arrangement of sensors shown in FIG. 5C is advantageous because process shift eccentricity and angular misalignment can be detected simultaneously which eliminates the need to rotate the wafer to detect angular misalignment β (FIG. 4). The arrangement of FIG. 5C can be used only if the process shifts are small enough such that the two inner sensors (sensors 42B1 and 42C1 of FIG. 5C) are on flat side 28. The polar coordinates of the periphery points 44A1, 44B1, 44C1, 44D1 are determined for the sensors in FIG. 5C in the same manner as that described above for FIG. 4. Appendix A shows the formulae for process shift detection using spinning fiber optic sensors (also referred to as "s.f. sensors" and described below in reference to FIGS. 6A to 6D). Appendix A also lists the formulae for calculating the rotation angles used to correct the eccentricity and angular misalignment. Appendix B shows the software for process shift detection using the formulae of Appendix A. Using a sensor array in accordance with this invention to detect process shifts in the wafer's position (i.e. center eccentricity and flat side misalignment) does not require rotation of the wafer as was done in the prior art mechanism.

Figure 5D:
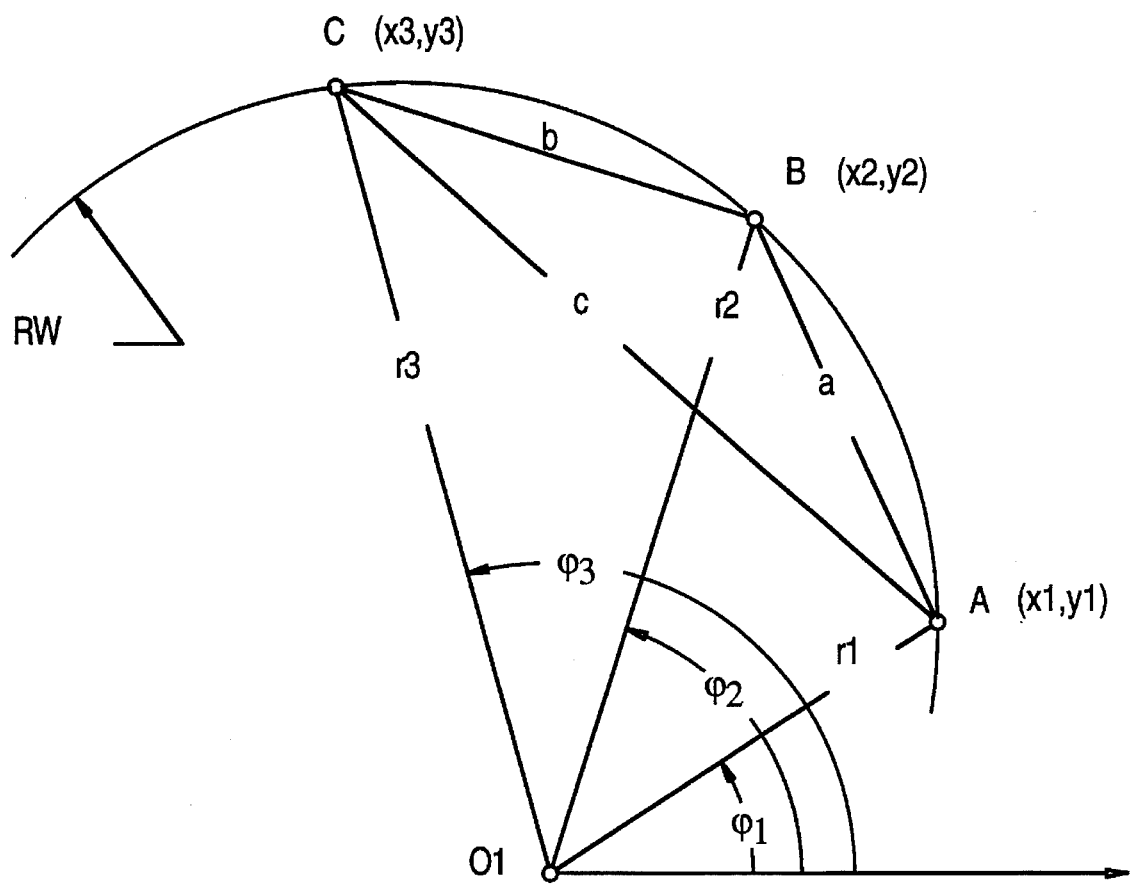
FIGS. 5D and 5E illustrate a method for computation of the center and radius of the wafer.

Microprocessor 48 computes the radius and the center of the wafer from the polar coordinates of the three points A, B and C (see FIG. 5D) using geometric principles well known to a person of skill in the art. For example, RW can be calculated by microprocessor 48 as follows:

$$RW = \frac{a \cdot b \cdot c}{4K}$$

where $$a = \sqrt{r_1^2 + r_2^2 - 2r_1 r_2 \cos(\phi_1 - \phi_2)}$$

$$b = \sqrt{r_2^2 + r_3^2 - 2r_2 r_3 \cos(\phi_3 - \phi_2)}$$

$$c = \sqrt{r_1^2 + r_3^2 - 2r_1 r_3 \cos(\phi_3 - \phi_1)}$$

$$K = \frac{1}{2} \begin{bmatrix} 1 & x_1 & y_1 \\ 1 & x_2 & y_2 \\ 1 & x_3 & y_3 \end{bmatrix}$$

-continued $$y_1 = r_1 \sin\phi_1 \qquad x_1 = r_1 \cos\phi_1$$
$$y_2 = r_2 \sin\phi_2 \qquad x_2 = r_2 \cos\phi_2$$
$$y_3 = r_3 \sin\phi_3 \qquad x_3 = r_3 \cos\phi_3$$

Figure 5E:
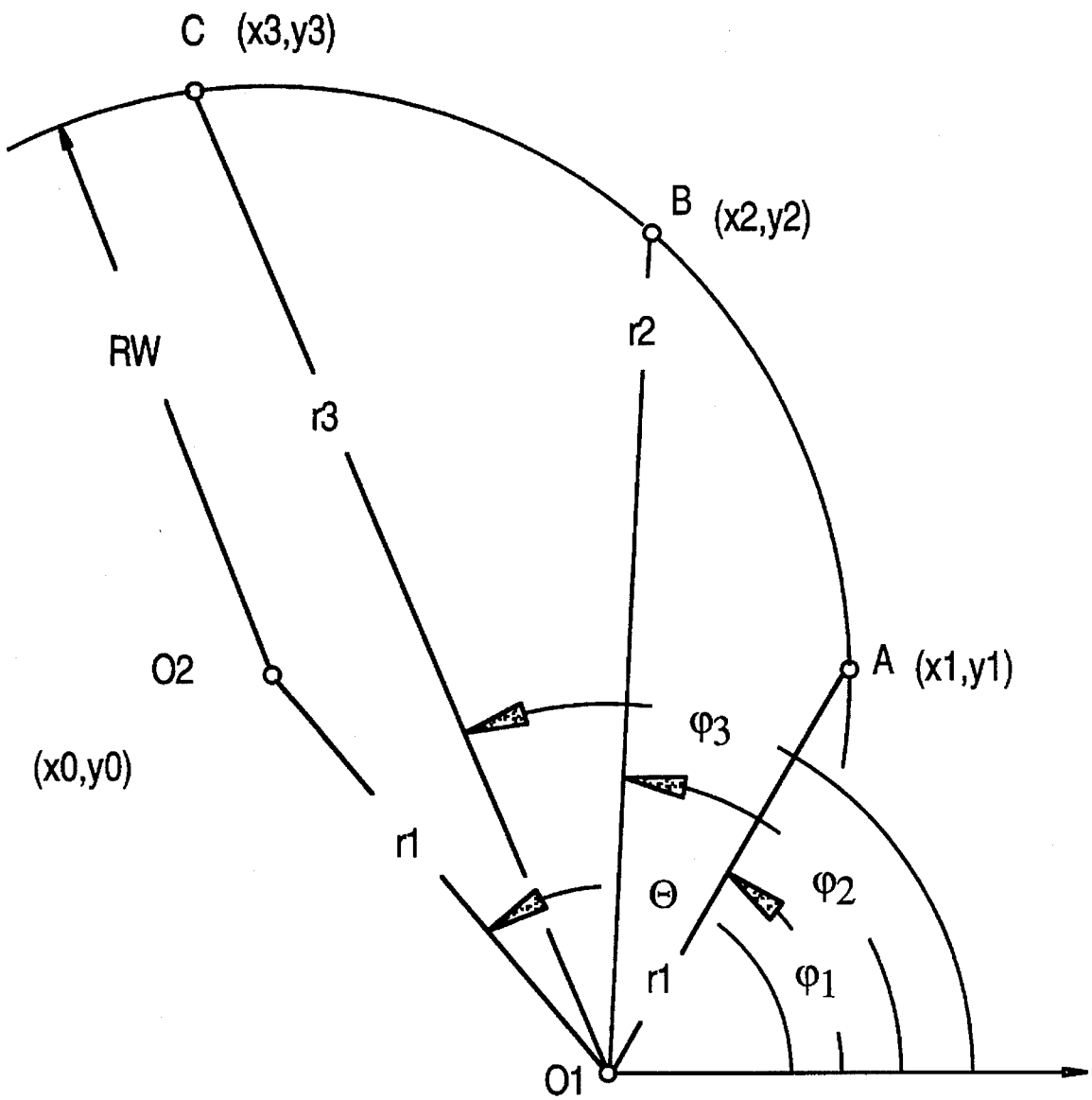

Using the above formulae (see FIG. 5D) microprocessor computes the radius of the wafer four times for points ABD, BCD and ACD in addition to points ABC as described above for four combinations of three points. Microprocessor 48 then selects the specific combination of three points that yield a radius closest to the known wafer radius. Then microprocessor 48 computes the position of center of the circle passing through the selected three points A, B and C as follows (see FIG. 5E):

$$x_0 = -\frac{1}{D} \begin{bmatrix} 1 & y_1 & r_1^2 \\ 1 & y_2 & r_2^2 \\ 1 & y_3 & r_3^2 \end{bmatrix}$$

$$y_0 = -\frac{1}{D} \begin{bmatrix} 1 & x_1 & r_1^2 \\ 1 & x_2 & r_2^2 \\ 1 & x_3 & r_3^2 \end{bmatrix}$$

$$D = \begin{bmatrix} 1 & x_1 & y_1 \\ 1 & x_2 & y_2 \\ 1 & x_3 & y_3 \end{bmatrix}$$

$$y_1 = r_1 \sin\phi_1 \qquad x_1 = r_1 \cos\phi_1$$
$$y_2 = r_2 \sin\phi_2 \qquad x_2 = r_2 \cos\phi_2$$
$$y_3 = r_3 \sin\phi_3 \qquad x_3 = r_3 \cos\phi_3$$

$$\tan\theta = \frac{x_0}{y_0} \text{ and } \Delta r = \sqrt{x_0^2 + y_0^2}$$

Figure 8:
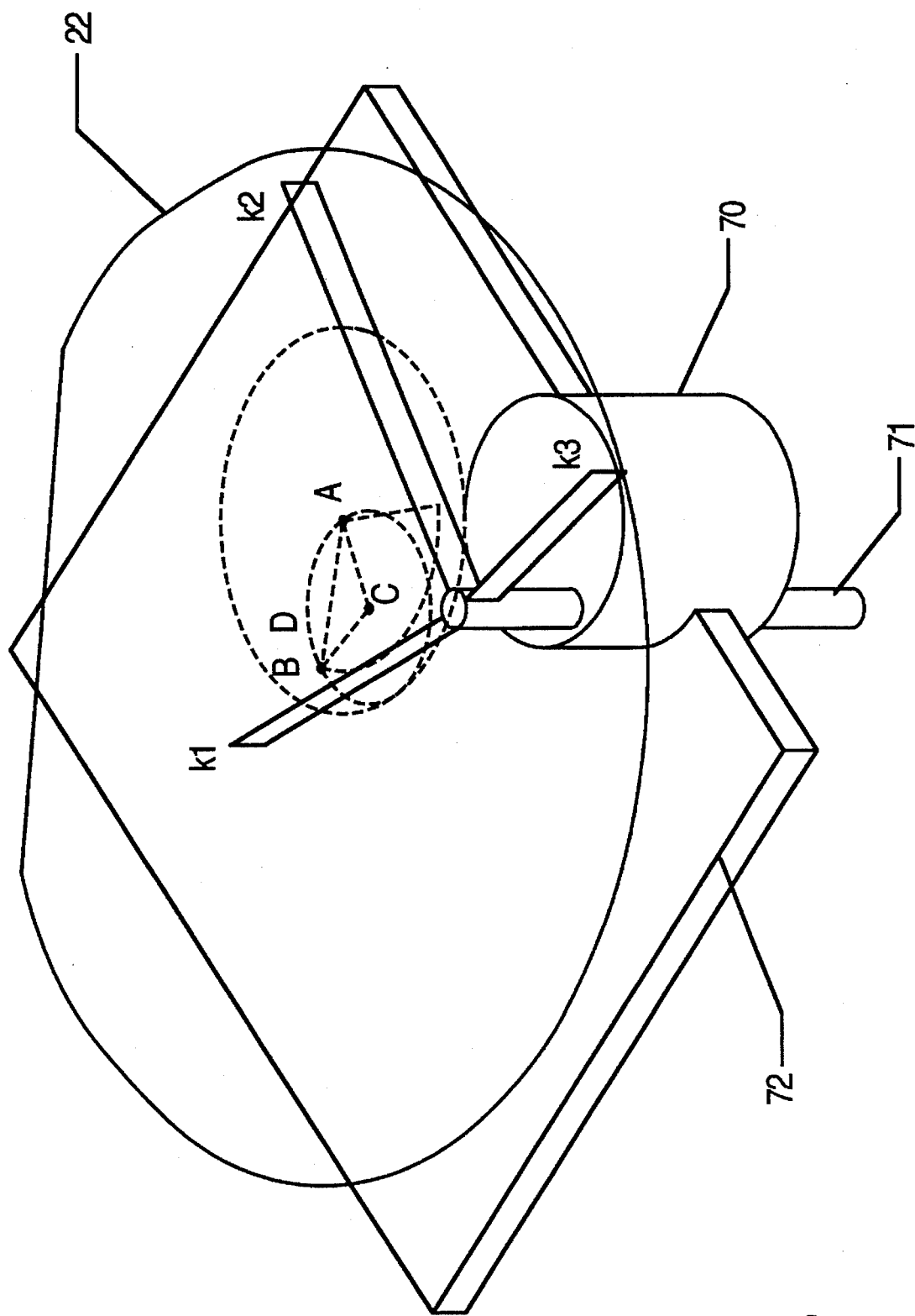
FIG. 8 illustrates a perspective view of the aligner after rotation of the outer shaft to position the inner shaft at a pre-determined location.
Figure 9:
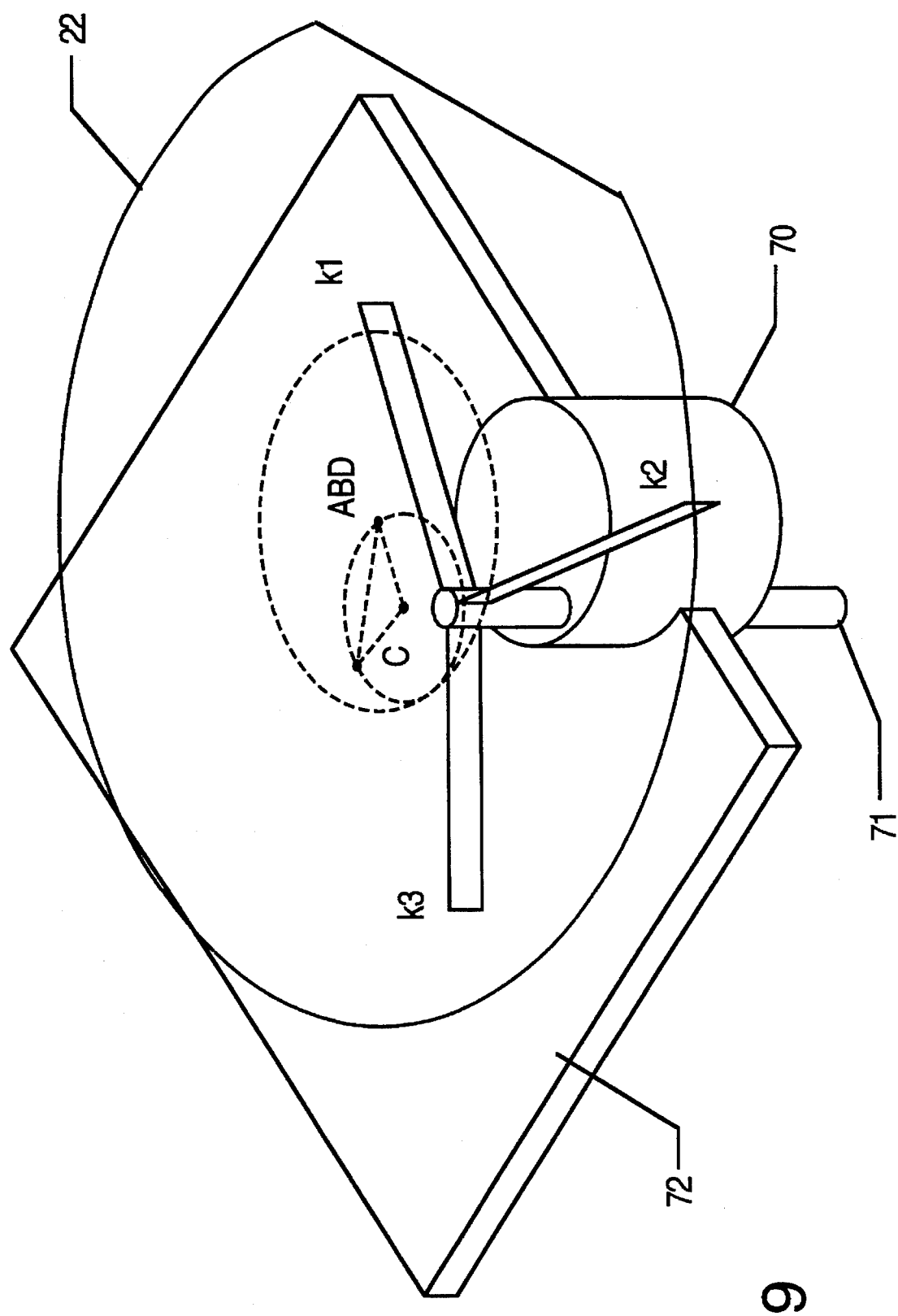
FIG. 9 illustrates a perspective view of the aligner after the inner shaft is rotated by the calculated angle so that the wafer center coincides with the center of the outer shaft.

In accordance with this invention the sensor array detects process shifts in the wafer's position in a non-contact manner while the wafer is stationary on the robot arm's end effector so that no handout is required. Moreover, the sensor array permits very high speeds and reduces particulate contaminants because no rotation of the wafer is required. After the wafer's position is determined by use of sensor array 32A or 32B, the eccentricity Δr (which occurs at angle θ) and angular misalignment (calculated by formula 44 in Appendix A) of wafer 22 can be corrected by aligner 34A or 34B as described below in reference to FIGS. 7, 8 and 9.

Figure 6A:
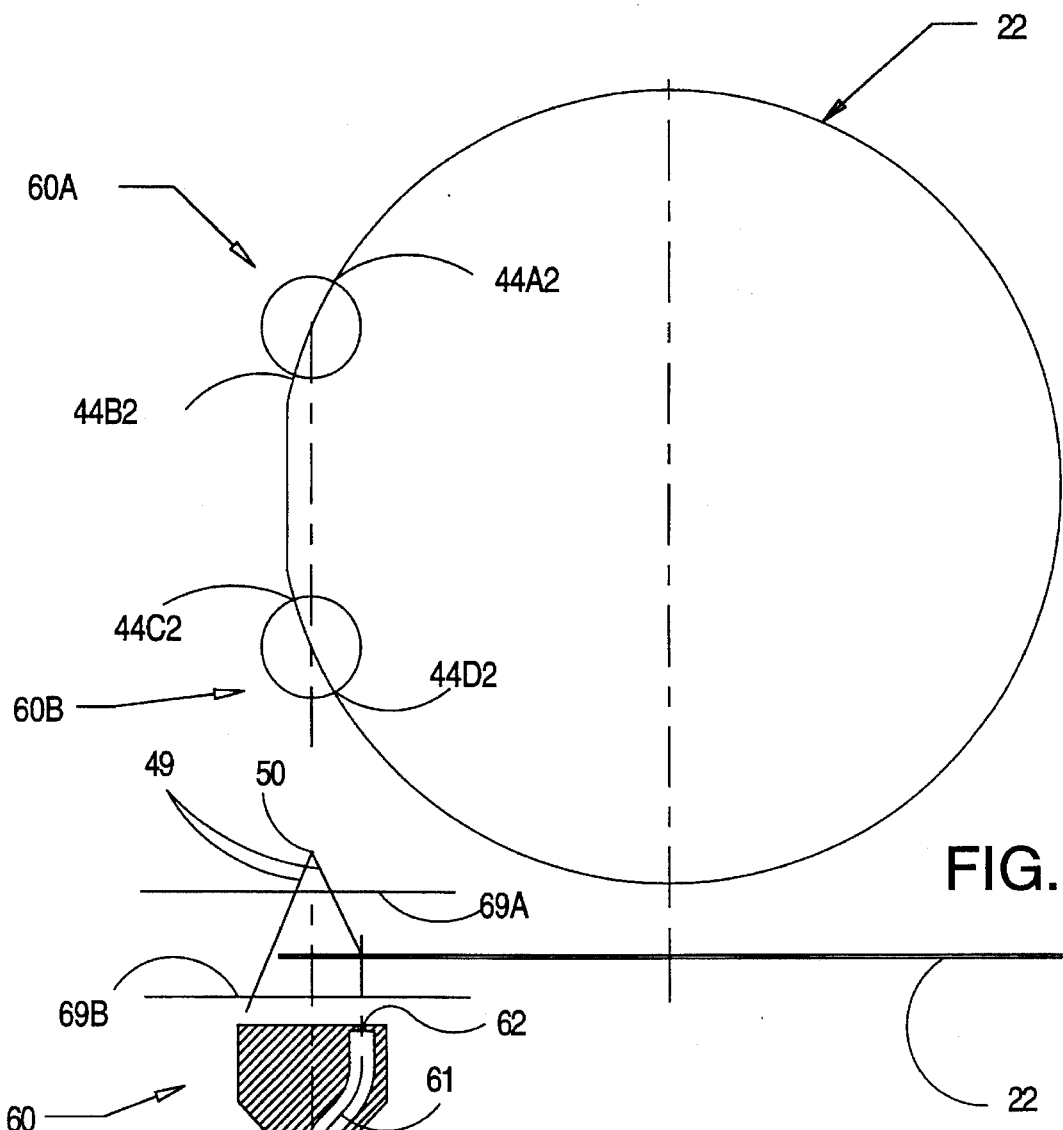
FIGS. 6A, 6B, 6C and 6D illustrate a plan view, a front elevation view, and two perspective views of an alternate method and apparatus for determining the position of a wafer using spinning fiber optic sensors in accordance with this invention.
Figure 6B:
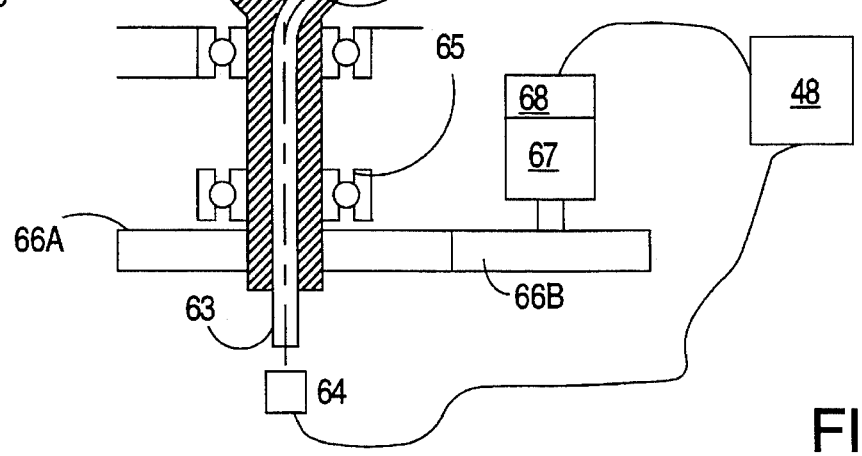

FIGS. 6A, 6B, 6C and 6D illustrate a plan view, a sectional view and two perspective views of an alternate method and apparatus for determining the position of a wafer using spinning fiber optic sensors in accordance with this invention. FIG. 6A shows two fiber optic sensors 60A and 60B placed at the periphery of a wafer so as to detect four points on the edge of the wafer. A fiber optic sensor 60 (FIG. 6B) includes an optical fiber 61 which has one end 62 offset from central axis 51 of sensor 60. The other end 63 of optical fiber 61 is concentric with sensor 60 and faces a light detector 64. Sensor 60 is mounted in a bearing 65 and is rotated via gear 66A along central axis 51 that passes through concentric end 63. Gear 66A is driven via gear 66B by motor 67 having an optical encoder 68. Optical encoder 68 signals the position of motor 67 to microprocessor 48. A source of light 50 and spinning fiber optic sensors 60A and 60B are placed outside the vacuum enclosure of apparatus 30, behind windows (such as windows 69A and 69B).

Figure 6C:
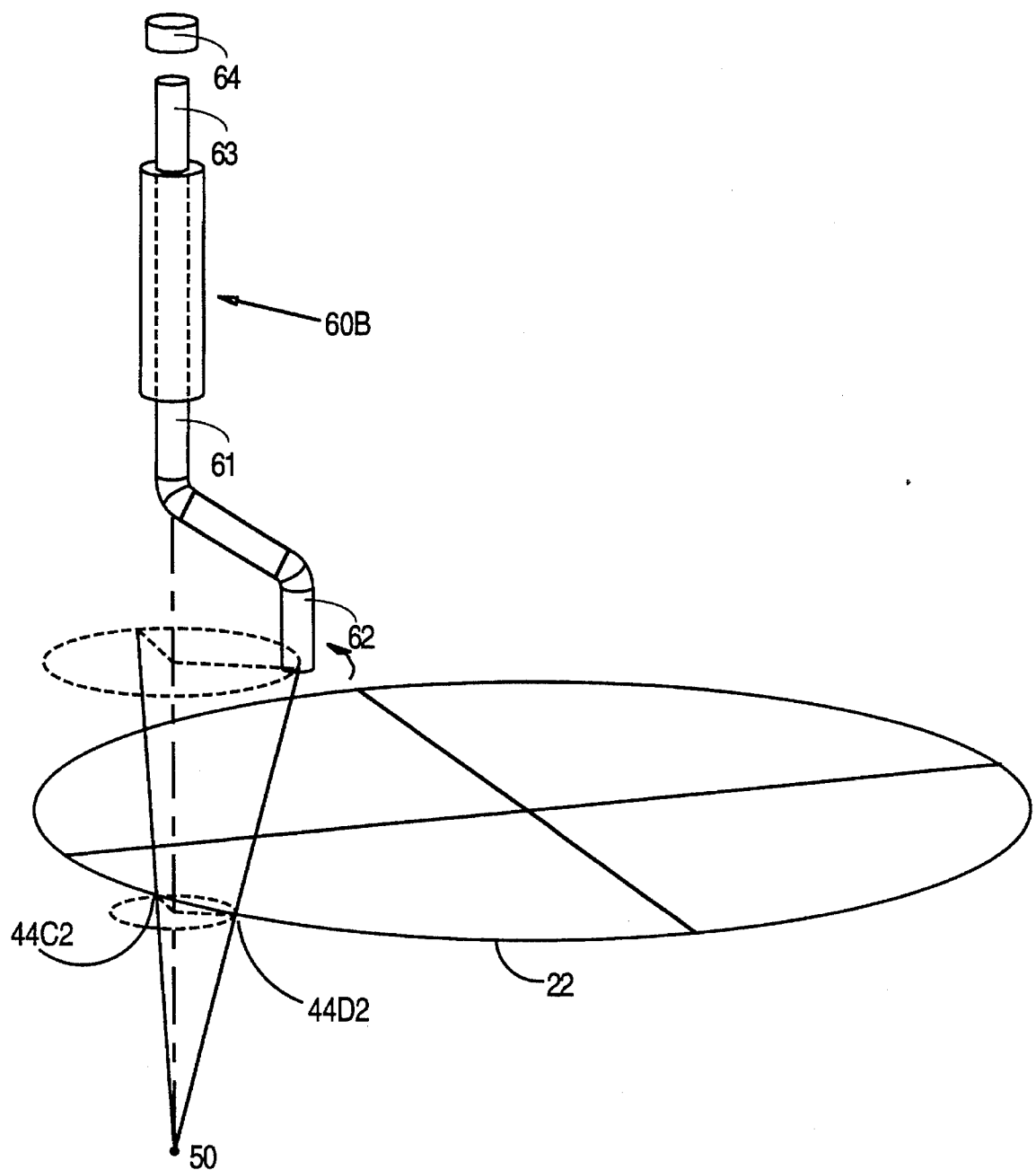
Figure 6D:
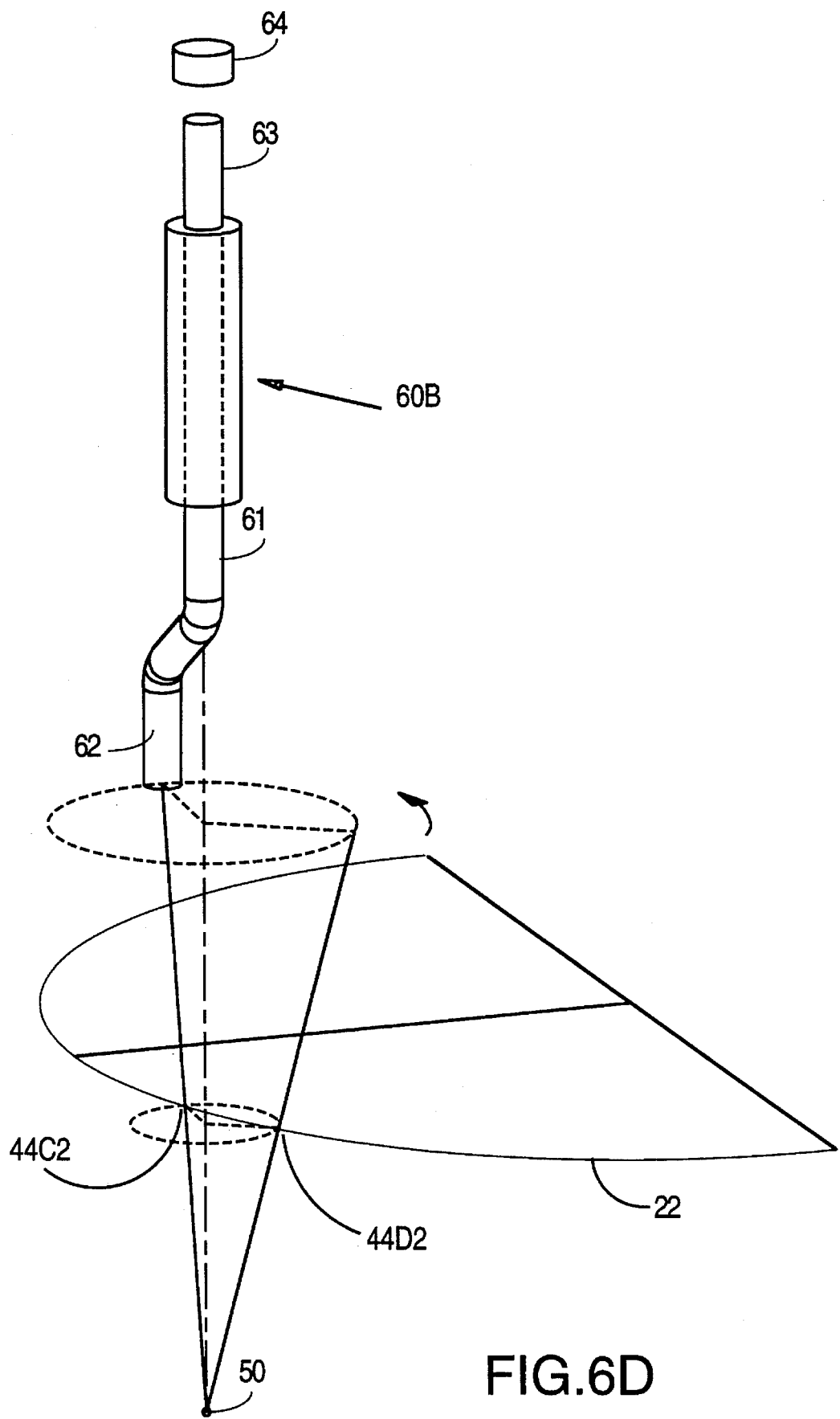

FIG. 6C shows a perspective view of one embodiment of fiber optic sensor 60B and wafer 22 in relation to source of light 50. FIG. 6D shows sensor 60B at a position in its rotation different from its position in FIG. 6C.

To detect points 44A2, 44B2, 44C2 and 44D2, the two sensors 60A and 60B (see FIG. 6A) are rotated anti-clockwise through 360°. During rotation of each of sensors 60A and 60B, there is a sudden transition in the amount of light falling on the corresponding light detector 64 when offset end 62 of optical fiber 61 crosses the periphery of wafer 22. From such sudden transitions, sensor 60A determines periphery points 44A2 and 44B2 and sensor. 60B determines periphery points 44C2 and 44D2. During rotation, sensor 60A experiences a transition from darkness to light at point 44A and a transition from light to darkness at point 44B. Similarly sensor 60B experiences a transition from darkness to light at point 44C and a transition from light to darkness at point 44D. Microprocessor 48 determines the wafer's eccentricity and misalignment from the signals of optical encoders 68 and light detectors 64 of sensors 60A and 60B (See Appendixes A and B for a method of using spinning fiber optic sensors to detect the wafer's eccentricity and angular misalignment). One advantage of using a spinning fiber optic sensor is that only two sensors at the periphery of the wafer are required thus resulting in low cost in comparison with using four CCD sensors and their accompanying electronic circuitry.

FIG. 7 illustrates a perspective view of an embodiment of an aligner for correcting eccentricity and angular misalignment of the wafer using two rotatable shafts in accordance with this invention. As shown in FIG. 7, each aligner (such as 34A or 34B of FIG. 3) has an outer shaft 70 and an inner shaft 71. Outer shaft 70 is capable of rotation relative to housing base 72. Ferrofluidic seals are provided between outer shaft 70 and housing base 72 as well as between outer shaft 70 and inner shaft 71. Both shafts 70 and 71 are equipped with electric motors having optical encoders (not shown) which continuously report the angular positions of their respective shafts to microprocessor 48. Inner shaft 71 is mounted inside outer shaft 70 with the inner shaft's rotation axis parallel to, but offset from, the outer shaft's rotation axis, by the distance AC. Inner shaft 71 is capable of rotation relative to outer shaft 70. Inner shaft 71 has a turntable (including arms K1, K2 and K3) at one end to support and rotate the wafer 22.

To correct the eccentricity, outer shaft 70 is rotated prior to arrival of wafer 22 in order to position inner shaft 71 at a predetermined location (depending the eccentricity to be corrected). After wafer 22 is placed on the turntable, inner shaft 71 is rotated by the required angle to eliminate the wafer's eccentricity in a single movement.

Initially, as shown in FIG. 7 wafer 22 is supported by the end effector of the robot arm (not shown), and is raised above the turntable's arms (K1, K2 and K3). The point "C" lies on the extension of the inner shaft's rotation axis and on the bottom surface of the wafer 22. The point "A" lies on the extension of the outer shaft's rotation axis and on the bottom surface of the wafer 22. The circle "p" is defined by its center "C" and radius AC The circle "R" is defined by its center "A" and its radius which equals the diameter of the circle "p". Point "B" is the center of the circular portion of the periphery of wafer 22. The point "D" is obtained by drawing an arc intersects with the circle "p".

As soon as microprocessor 48 has calculated the location of center "B" of wafer 22 (as described above in reference to FIGS. 4 and 5A to 5E) the microprocessor 48 calculates angle DAB based on the known position of the aligner's inner shaft 71. Then the microprocessor sends a signal to outer shaft's motor to execute rotation by the angle DAB in order to bring point D to the point B. The DAB rotation is completed while the wafer is supported by the end effector (therefore there is no restriction on the rotation speed of outer shaft 70). After completion of the DAB rotation, a signal is sent by microprocessor 48 to the robot arm (not shown in FIG. 7) to lower the wafer onto the turntable's three arms K1, K2 and K3 so that the point D coincides with point B (see FIG. 8). Simultaneously with calculating angle DAB, microprocessor 48 also calculates angle CDA (see FIGS. 7 and 8). Therefore, as soon as wafer 22 is in the position shown in FIG. 8, microprocessor 48 sends a signal to the motor of inner shaft 71 to execute rotation by the angle CDA. Such a rotation brings center B of wafer 22 to point A (see FIG. 9), thus eliminating the wafer's eccentricity in a single movement of inner shaft 71. If the robot arm 14 picks the wafer 22 up at this stage, the wafer 22 will be placed on the end effector 40 with the wafer's center coincident with the end effector's center (see FIGS. 5A and 5C).

One advantage of the two shaft aligner is that the wafer's eccentricity is corrected in a single movement of the wafer by the inner shaft. Such single movement correction of eccentricity permits higher speeds and minimizes particulate contaminants. Another advantage of the two shaft aligner is that centering and alignment of wafers are accomplished without any fork and bellows. Utilizing rotary seals in the aligner reduces generation of particulates and thus results in a very high degree of cleanliness.

In the two shaft aligner described above, the largest eccentricity correctable in a single movement of the wafer is 2AC where AC is the distance between the outer shaft center and the inner shaft center. For any given application, the distance between the centers of the two shafts (i.e. distance AC) is selected to correct the largest eccentricity expected in that application.

In some instances it may be necessary to correct angular misalignment of the characteristic edge of a workpiece after any eccentricity has been corrected. For initial shifts, a wafer's angular misalignment is detected by rotating the wafer and continuously sampling the $d_i$ signals (see FIG. 5A) from the sensors 42A to 42D indicating the wafer's edge and comparing to the angular position of the wafer. The angular location of the flat side is computed by the microprocessor and is used to rotate the outer shaft by the necessary correction angle to bring the flat side of the wafer to its desired position. One advantage of this type of rotation is that there is minimal danger of the wafer shifting during rotation because the wafer's center of mass has already been moved close to or coincident with the wafer's center of rotation to correct eccentricity. So higher rotation speeds can be used in this invention for detecting the position of the flat side of the wafer and thus system throughput can be enhanced.

Furthermore, for process shifts, angular misalignment $\lambda_1$ is detected along with eccentricity as shown in Appendix A. For process shift correction, the outer shaft can be rotated simultaneously with the inner shaft rotation so that both eccentricity as well as angular misalignment of a wafer are corrected in the shortest possible time.

During operation, whenever a process requires precise wafer alignment, robot arm 14 brings wafer 22 to sensor array 32A or 32B (for initial or process shift detection). Microprocessor 48 computes the wafer's eccentricity as described above using sensor data from array 32A or 32B. To correct a wafer's eccentricity, microprocessor 48 causes outer shaft 70 of the aligner (such as 34A or 34B) to rotate in order to position inner shaft 71 in the appropriate position to receive the wafer 22. Then robot arm 14 places wafer 22 on the turntable of inner shaft 71. Then inner shaft 71 is rotated through the angle calculated by microprocessor 48. Optionally, microprocessor 48 causes the outer shaft to rotate as necessary to detect initial shift angular misalignment. No rotation is required to detect process shift angular misalignment because the angular misalignment is detected along with eccentricity (see Appendix A). Microprocessor 48 causes the outer shaft 70 to rotate as necessary to correct any angular misalignment. Then robot arm 14 transfers wafer 22 to the next process chamber.

Figure 10:
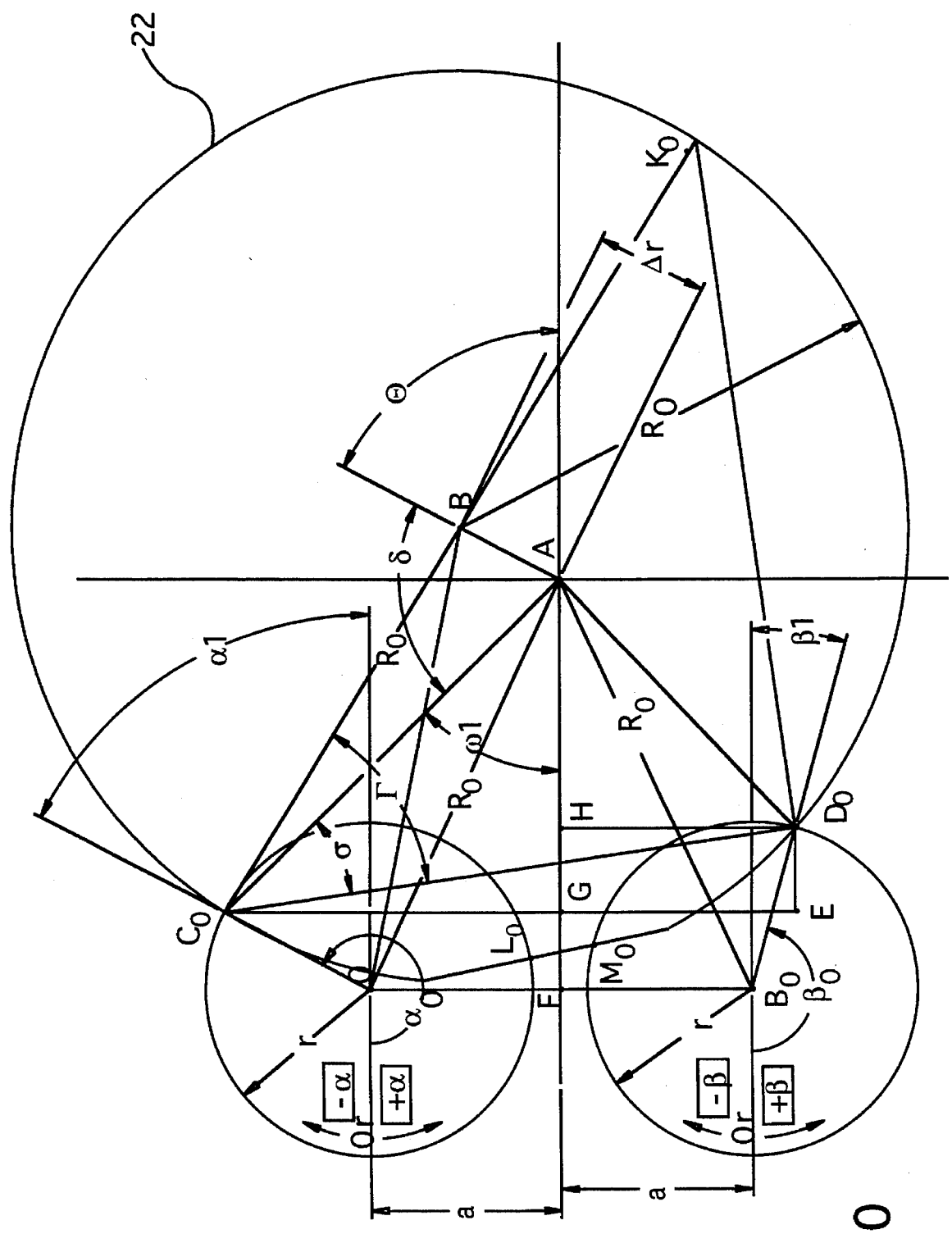
FIG. 10 illustrates a method to determine the position of center of a wafer due to process shifts using two fiber optic sensors.
Figure 11:
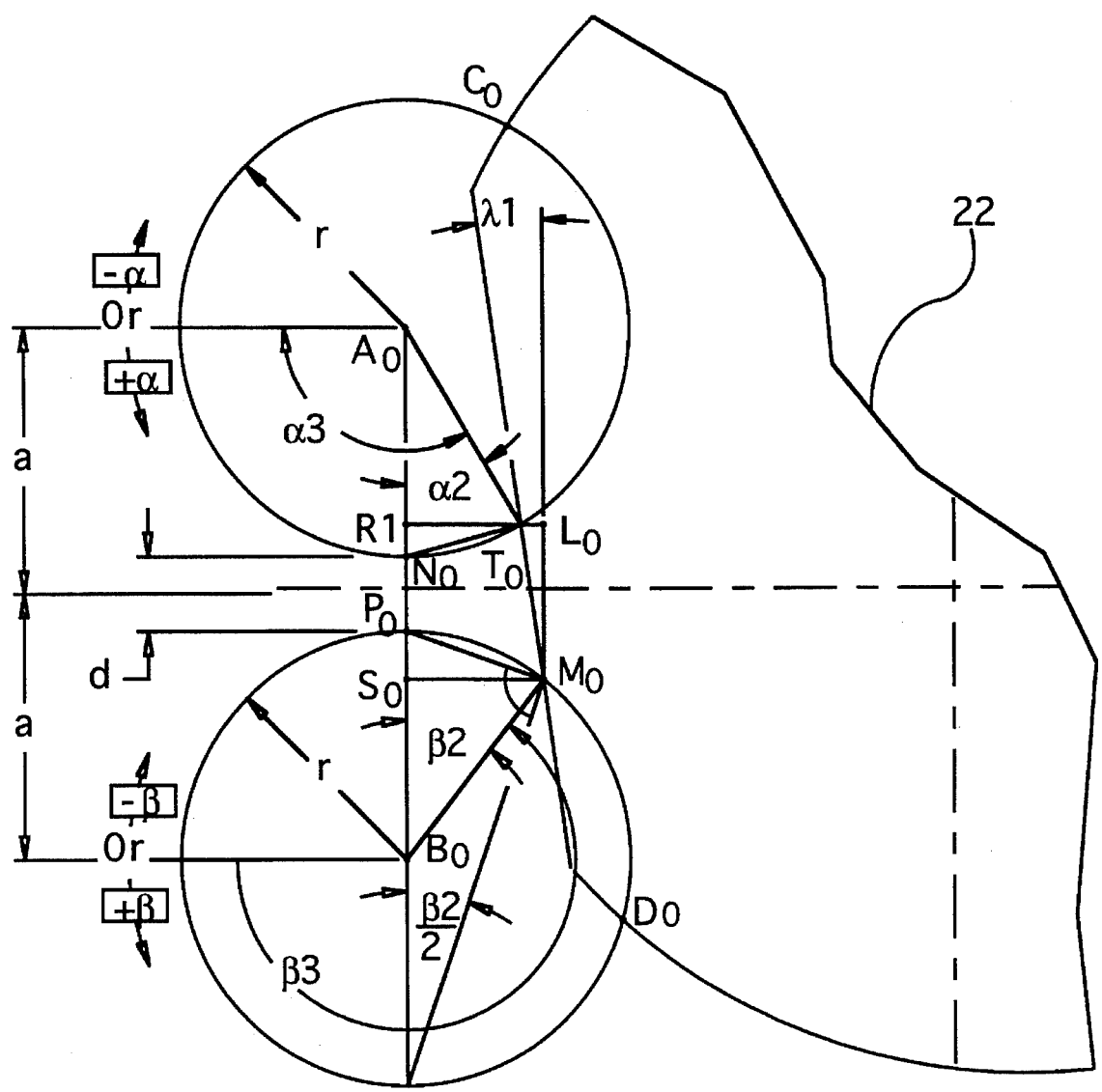
FIG. 11 illustrates a method to determine the angular misalignment of a wafer due to process shifts.
Figure 12:
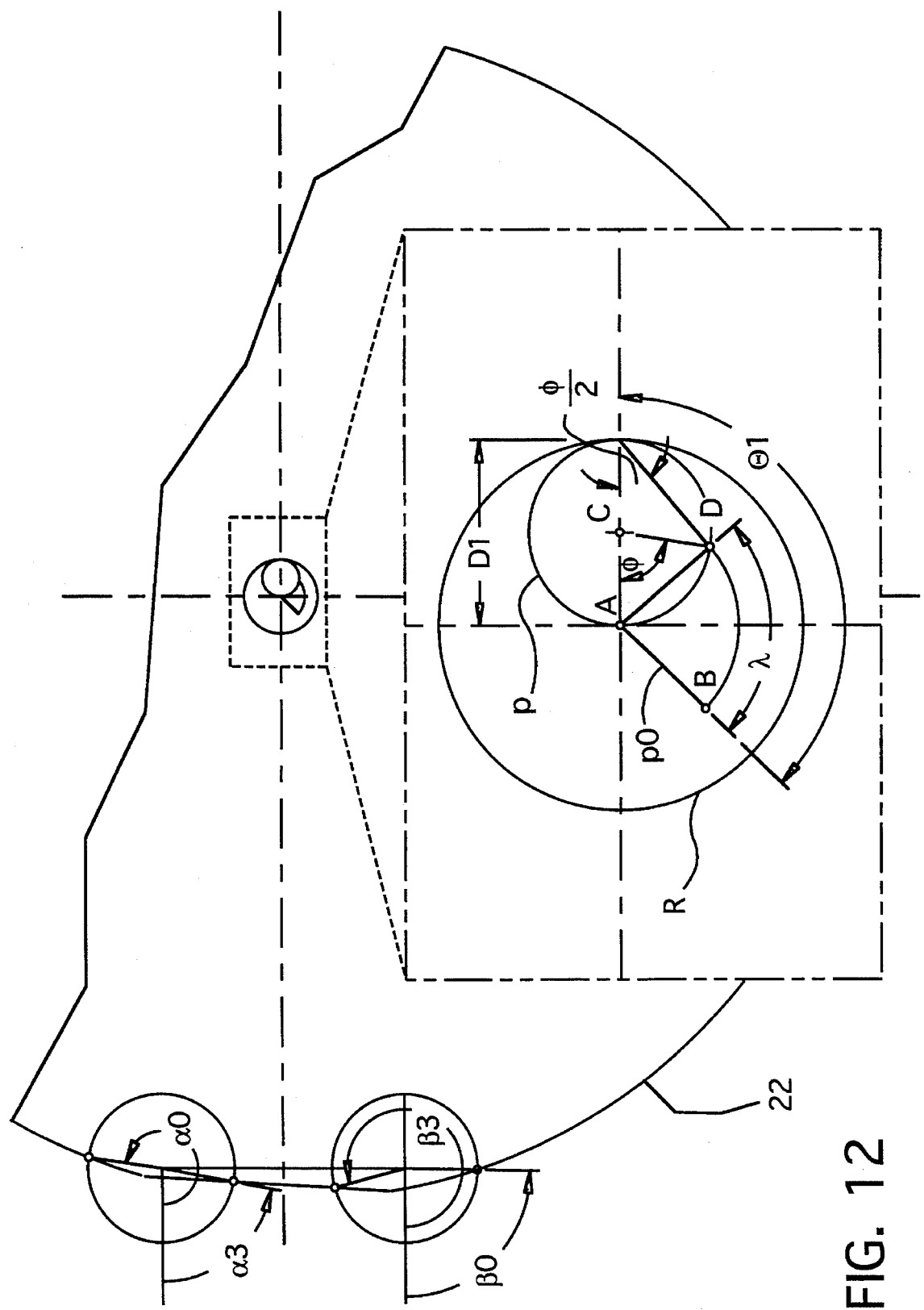
FIG. 12 illustrates the angles of rotation of the inner and outer shafts of a wafer aligner.

FIGS. 10, 11 and 12 illustrate a method to determine the eccentricity the wafer's center, the wafer's angular misalignment and the angles of rotation of the inner and outer shafts of the wafer aligner. See Appendix A for a list of formulae and Appendix B for software to detect the offset of wafer's center and the wafer's angular misalignment in reference to FIGS. 10, 11 and 12.

Although FIG. 5C discloses four sensors, in accordance with this invention it is possible for a person of ordinary skill in the art to detect process shifts of wafer 22 using only three sensors and wafer shape information.

The above description of various embodiments of this invention is intended to be merely illustrative and not limiting. Numerous other embodiments will be apparent to those skilled in the art, all of which are included in the broad scope of this invention. For example, linear CCD sensors and spinning fiber optic sensors are only examples of several devices that can detect location of points on the periphery of a workpiece. Moreover, workpieces that may be centered and aligned in accordance with this invention are not restricted to the shapes of wafers disclosed above. For example, circular discs as well as various types of polygonal or irregularly shaped workpieces can be centered and aligned. The scope of this invention is limited only by the appended claims.

APPENDIX A

Detailed sequence of formulas used as an outline for software, which calculates aligner's (34B FIG. 3) movements. In this case instead of four CCD sensors (32B, FIG. 3) two spinning fiberoptic sensors are used. Formulas relate to FIG. 10, 11, 12.

Given constant inputs:
$R_0$: Radius of the wafer
$r$: Radius of spinning fiberoptic sensor reduced to the plane of the wafer.
$a$: Half of the distance between axes of rotation of the two s.f. sensors.
$D1$: Diameter of the circle "P" (FIG. 7).
$\pi$: 3.1415 ...

Given variable inputs:
$\alpha_0, \beta_0, \alpha_3, \beta_3$: Angles of rotation at which s.f. sensors detect transition from dark to light or vice versa.

1. $\alpha_1 = \alpha_0 - \pi$
2. $\beta_1 = \pi - \beta_0$
3. $\alpha_2 = \alpha_3 - 0.5\pi$
4. $\beta_2 = 1.5\pi - \beta_3$
5. $C_0E = 2 \cdot a + r \cdot \sin(\alpha_1) + r \cdot \sin(\beta_1)$
6. $ED_0 = r \cdot \cos(\beta_1) - r \cdot \cos(\alpha_1)$ APPENDIX A -continued 7. $\overline{C_0 D_0} = \sqrt{\overline{C_0 E}^2 + \overline{ED_0}^2}$ 8. $\overline{FA} = \sqrt{R_0^2 - a^2}$ 9. $\overline{GA} = \overline{FA} - r \cdot \cos(\alpha_1)$
10. $\overline{HA} = \overline{FA} - r \cdot \cos(\beta_1)$
11. $C_0 G = a + r \cdot \sin(\alpha_1)$
12. $EG = a + r \cdot \sin(\beta_1)$ 13. $\overline{C_0 A} = \sqrt{\overline{C_0 G}^2 + \overline{GA}^2}$ 14. $\overline{EG} = \overline{D_0 H}$ 15. $\overline{D_0 A} = \sqrt{\overline{D_0 H}^2 + \overline{HA}^2}$ 16. $m = \dfrac{\overline{C_0 A}^2 + \overline{C_0 D_0}^2 - \overline{D_0 A}^2}{2 \, \overline{C_0 A} \cdot \overline{C_0 D}}$ 17. $\sigma = a\cos(m)$
18. $C_0 K_0 = 2 \cdot R_0$ 19. $n = \dfrac{C_0 D_0}{2 \cdot R_0}$ 20. $= a\cos(n)$ 21. $t = \dfrac{-\sigma}{|-\sigma|}$ $\quad (t = \pm 1)$ 22. $p_0 = AB$ (same as $\Delta r$ on FIG. 4)
23. $C_0 B = R_0$ 24. $p_0 = \sqrt{R_0^2 + \overline{C_0 A}^2 - 2 R_0 \cdot \overline{C_0 A} \, \cos(\ - \sigma)}$ 25. $z = \dfrac{\overline{GA}^2 + \overline{C_0 A}^2 - \overline{C_0 G}^2}{2 \cdot \overline{GA} \cdot \overline{C_0 A}}$ 26. $\omega 1 = a\cos(z)$ 27. $s = \dfrac{p_0^2 + \overline{C_0 A}^2 - \overline{C_0 G}^2}{2 \cdot p_0 \cdot \overline{C_0 A}}$ 28. $\delta = a\cos(s)$
29. $\theta = \pi - \omega 1 - (t \cdot \delta)$ $\quad (0 < \theta < 2\pi)$
30. $w = \cos(\theta)$
31. $\theta 1 = a\cos(w)$ $\quad (0 < \theta 1 < \pi)$ 32. $q = \dfrac{\sin(\theta)}{|\sin(\theta)|}$ $\quad (q = \pm 1)$ 33. $\lambda = \left[ \theta 1 - a\cos\left( \dfrac{p_0}{D1} \right) \right] \cdot q$ (see FIG. 12)

$\lambda$: angle of rotation of the outer shaft of the aligner prior to arrival of the wafer.

34. $\phi = 2 \cdot q \cdot a\sin\left( \dfrac{p_0}{D1} \right)$ since $\left( \dfrac{p_0}{D1} = \sin\left( \dfrac{\phi}{2} \right) \right)$ $\phi$: angle of rotation of the inner shaft of the aligner to eliminate wafer's eccentricity in a single movement.

35. $d = 2(a - r)$ (see FIG. 11)

APPENDIX A -continued

36. $\overline{P_0M}_0 = 2 \cdot r \cdot \sin\left(\frac{\beta 2}{2}\right)$

37. $\overline{P_0S}_0 = \overline{P_0M}_0 \cdot \sin\left(\frac{\beta 2}{2}\right)$ $\quad \left(<P_0M_0S_0 = \frac{\beta 2}{2}\right)$ 38. $\overline{N_0T}_0 = 2 \cdot r \cdot \sin\left(\frac{\alpha 2}{2}\right)$ 39. $\overline{R1N}_0 = \overline{N_0T}_0 \cdot \sin\left(\frac{\alpha 2}{2}\right)$ 40. $\overline{L_0M}_0 = d + \overline{R1N}_0 + \overline{P_0S}_0$
41. $\overline{R1T}_0 = r \cdot \sin(\alpha 2)$
42. $\overline{S_0M}_0 = r \cdot \sin(\beta 2)$ 43. $w1 = \dfrac{\overline{R1T}_0 + \overline{S_0M}_0}{\overline{L_0M}_0}$ 44. $\lambda 1 = a\tan(w1)$ (same as β on FIG. 4)

45. $\boxed{\epsilon = \lambda 1 - \phi}$

ε: angle of rotation of the outer shaft that counters rotation of the inner shaft and corrects angular misalignment β in one movement.

APPENDIX B

| | |
|---|---|
| COPYRIGHT (C): | 1993, All Rights Reserved. |
| PROJECT: | Wafer aligner calculation |
| FILE: | wafer1.c |
| PURPOSE: | This program takes in several inputs and calculates necessary angles for proper alignment of wafer |
| START DATE: | 12/11/93 |
| PROGRAMMER: | Ralph Niewmierzycki |

```c
#include <stdio.h>
#include <stdlib.h>
#include <conio.h>
#include <math.h>
#define R    3.937
#define r    0.5
#define a    0.830417
#define D    0.25
#define PI   M_PI
void main(void)
    double   CE,ED,CD,FO,GO,HO,CG,EG,CO,DO,m,n,t,p,
             z,s,w,q,d,PM,PS,NT,RN,LM,RT,SM,w1;
    double   sigma,gamma,omega,delta,theta_1,theta_2,
             lambda_1,phi,lambda_2,epsilon;
    double   alpha_0,alpha_1,alpha_2,alpha_3,
             beta_0,beta_1,beta_2,beta_3;
    double   test;
    clrscr();
    /* first, get the inputs from the user */
    printf("Type in the four angles");
    printf("\nAlpha 0: ");
    scanf("%lf", &alpha_0);
    printf("\nAlpha 3: ");
    scanf("%lf", &alpha_3);
    printf("\nBeta 0: ");
    scanf("%lf", &beta_0);
    printf("\nBeta 3: ");
    scanf("%lf", &beta_3);
    alpha_0 = 1.206284;
    beta_0 = 0.980232;
    alpha_3 = 0.183569;
    beta_3 = -0.246665;
    /* first define alpha_1 and beta_1 */
    beta_1 = PI - beta_0;
```

APPENDIX B -continued

```c
    /* then define alpha_2 and beta_2 */
    alpha_2 = alpha_3 - (0.5) * PI;
    beta_2 = (1.5) * PI - beta_3;
    /* now, start the 38 steps */
//1
    CE = 2*a + r*sin(alpha_1) + r*sin(beta_1);
//2
    ED = r*cos(beta_1) - r*cos(alpha_1);
//3
    CD = sqrt(CE*CE + ED*ED);
//4
    FO = sqrt(R*R - a*a);
//5
    GO = FO - r*cos(alpha_1);
//6
    HO = FO - r*cos(beta_1);
//7
    CG = a + r*sin(alpha_1);
//8
    EG = a + r*sin(beta_1);
//9
    CO = sqrt(CG*CG + GO*GO);
//10
    DO = sqrt(EG*EG + HO*HO);
//11
    m = (CO*CO + CD*CD - DO*DO)/(2*CO*CO);
//12
    sigma = acosl(m);
//13
    n = CD/(2*R);
//14
    gamma = acosl(n);
//15
    t = (gamma - sigma)/fabs(gamma - sigma);
//16
    p = sqrt(R*R + CO*CO - (2*R*CO*cosl(gamma - sigma)));
//17
    z = (GO*GO + CO*CO - CG*CG)/(2*GO*CO);
//18
    omega = acosl(z);
//19
    s = (p*p + CO*CO - R*R)/(2*p*CO);
//20
    delta = acosl(s);
//21
    theta_1 = PI - omega - (t*delta);
//22
    w = cosl(theta_1);
//23
    theta_2 = acosl(w);
//24
    /* D is #defined at top */
//25
    q = (sin(theta_1))/fabs( sin(theta_1 ) );
//26
    lambda_1 = (theta_2 - acosl(p/D))*q;
    printf("\nlambda: %.8lf", lambda_1);
//27
    phi = 2*q*asinl(p/D);
    printf("\nphi: %.8lf", phi);
//28
    d = 2*(a - r);
    /* second part */
//29
    PM = 2*r*sinl(beta_2/2);
//30
    PS = PM*sinl(beta_2/2);
//31
    NT = 2*r*sinl(alpha_2/2);
//32
    RN = NT*sinl(alpha_2/2);
//33
    LM = d + RN + PS;
//34
    RT = r*sinl(alpha_2);
//35
```

-continued

APPENDIX B

```
SM = r*sin(beta_2);
//36
w1 = (RT + SM)/LM;
//37
lambda_2 = atanl(w1);
printf("\nepsilon: %.8lf", epsilon);
}
```

I claim:

1. A method for locating a center of a substantially circular workpiece with a known radius, said method comprising:

determining the position of at least four points on a periphery of said workpiece using a plurality of sensors;

computing the radius of a circle passing through a combination of three of said points for each possible combination of three points;

selecting a specific combination of three points that yields a radius closest to said known radius; and determining a center of a circle passing through the selected combination of three points.

2. An apparatus for locating a center of a workpiece having a periphery with a substantially circular portion of a known radius and a flat side, said apparatus comprising:

at least four position sensors disposed in a housing around said periphery of a desired position of said workpiece, each of said sensors signalling the position of a point on said periphery; and means for computing, said means being operatively connected to each of said position sensors, said means (i) computing the radius of a circle passing through a combination of three of said points for each possible combination of three points, (ii) selecting a specific combination of three points that yields a radius closest to said known radius and (iii) locating the center of a circle passing through the selected combination of three points.

3. The apparatus of claim 2 wherein said sensors are disposed around said circular portion of said periphery such that a distance between any two adjacent sensors is at least equal to a length of said flat side.

4. The apparatus of claim 2 wherein two of said sensors are disposed around a circular portion of said periphery and other two of said sensors are disposed on said flat side of said periphery.

5. An apparatus for centering and aligning a workpiece comprising:

an outer member mounted rotatably in a housing and responsive to a first signal;

an inner member mounted rotatably in said outer member and responsive to a second signal, said inner member comprising a turntable for supporting said workpiece; and means for providing said first signal and said second signal, said means being operatively connected to said outer member and said inner member.

6. The apparatus of claim 5 wherein said means provides said second signal prior to placement of said workpiece on said turntable.

7. The apparatus of claim 5 wherein said means provides said first signal after placement of said workpiece on said turntable.

8. The apparatus of claim 5 wherein said outer member comprises an outer shaft and wherein said apparatus further comprises a rotary liquid seal interposed between said outer shaft and said housing.

9. The apparatus of claim 5 wherein said inner member comprises an inner shaft and wherein said apparatus further comprises a rotary liquid seal interposed between said inner shaft and said outer shaft.

10. The apparatus of claim 5 wherein said outer member is responsive to a third signal provided by said means, said third signal indicating a correction angle for bringing a flat side of said workpiece to a desired position.

11. A method for centering and aligning a workpiece using a rotatable inner member mounted within a rotatable outer member, said method comprising:

rotating said outer member until a point on a circle with a center identical to a center of said inner member, and a radius identical to a distance between a center of said outer member and a center of said inner member center coincides with a center of said workpiece prior to centering;

placing said workpiece on said turntable; and rotating said inner member until said workpiece center coincides with said outer member center.

12. The method of claim 11 further comprising the step of rotating said outer member to bring a flat side of said workpiece to a desired position.

13. An apparatus for detecting and correcting eccentricity of a workpiece of a known shape comprising:

a plurality of sensors disposed substantially around a periphery of said known shape, each of said sensors signalling the position of a point on a periphery of said workpiece;

an outer member mounted rotatably in a housing and responsive to a first signal;

an inner member mounted rotatably in said outer member and responsive to a second signal, said inner member comprising a turntable for supporting said workpiece; and means for computing operatively connected to each of said position sensors, said outer member and said inner member, wherein said means (i) computes eccentricity of said workpiece and (ii) provides said first signal and said second signal to correct said eccentricity.

14. A method for detecting and correcting the eccentricity of a substantially circular workpiece with a known radius using a plurality of sensors and an aligner comprising an inner member and an outer member, said method comprising:

determining the position of at least three points on a periphery of said workpiece using a plurality of sensors;

computing the radius of a circle passing through said three points; rotating said outer member until a point on a circle with a center identical to a center of said inner member and a radius identical to a distance between a center of said outer member and said inner member center coincides with a center of said workpiece prior to centering; and rotating said inner member until said workpiece center coincides with said outer member center.

15. An apparatus for centering and aligning a workpiece comprising:

an outer member mounted rotatably in a housing and responsive to a first signal, a rotational axis of said outer member intersecting said workpiece at a point A;

an inner member comprising a turntable for supporting said workpiece, said inner member being responsive to a second signal, said inner member comprising a shaft mounted rotatably in said outer member, a rotational axis of said shaft being parallel to and offset from said rotational axis of said outer member, said shaft axis intersecting said workpiece at a point C; and means for providing said first signal and said second signal, said first signal indicating one of arcs BD and BD', B being the position of the center of said workpiece prior to centering and alignment, D and D' being the points of intersection of a first circle with center C and radius AC and a second circle with center A and radius AB, said second signal indicating one of arcs AD and AD'.

16. The apparatus of claim 15 further comprising a plurality of position sensors disposed substantially around a circle, each of said sensors signalling the position of a point on the periphery of said workpiece to said means.

* * * * *